US010651865B2

(12) United States Patent
Bhandari et al.

(10) Patent No.: US 10,651,865 B2
(45) Date of Patent: May 12, 2020

(54) METHODS AND APPARATUS FOR MODULO SAMPLING AND RECOVERY

(71) Applicant: Massachusetts Institute of Technology, Cambridge, MA (US)

(72) Inventors: Ayush Bhandari, Cambridge, MA (US); Felix Krahmer, Garching (DE); Ramesh Raskar, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/025,991

(22) Filed: Jul. 2, 2018

(65) Prior Publication Data

US 2019/0103876 A1 Apr. 4, 2019

Related U.S. Application Data

(60) Provisional application No. 62/566,955, filed on Oct. 2, 2017.

(51) Int. Cl.
*H03M 1/12* (2006.01)
*H03K 3/3565* (2006.01)
*H03M 1/16* (2006.01)
*H03M 3/00* (2006.01)

(52) U.S. Cl.
CPC ........ *H03M 1/1245* (2013.01); *H03K 3/3565* (2013.01); *H03M 1/164* (2013.01); *H03M 3/434* (2013.01)

(58) Field of Classification Search
CPC ............................ H03M 1/245; H03M 1/1265

USPC .................................................. 341/155, 122
See application file for complete search history.

(56) References Cited

U.S. PATENT DOCUMENTS

| 4,086,536 A | * | 4/1978 | Acker | H03C 1/52 |
| | | | | 332/170 |
| 4,804,963 A | * | 2/1989 | Clapham | G01S 13/42 |
| | | | | 342/195 |
| 6,927,796 B2 | | 8/2005 | Liu et al. | |
| 7,492,400 B2 | | 2/2009 | El Gamal et al. | |
| 7,619,674 B2 | | 11/2009 | Han et al. | |

(Continued)

OTHER PUBLICATIONS

Chou, W., et al., Modulo sigma-delta modulation; published in IEEE Transactions on Communications, vol. 40, Issue 8, Aug. 1992.

(Continued)

*Primary Examiner* — Peguy Jean Pierre
(74) *Attorney, Agent, or Firm* — Stephen R. Otis

(57) ABSTRACT

A self-reset ADC may take a set of temporally equidistant, modulo samples of a bandlimited, analog signal, at a sampling rate that is greater than $\pi e$ samples per second, where $\pi$ is Archimedes' constant and $e$ is Euler's number. The bandlimited signal may have a bandwidth of 1 Hertz and a maximum frequency of 0.5 Hertz. These conditions of sampling rate, bandwidth and maximum frequency may ensure that an estimated signal may be recovered from the set of modulo samples. This estimated signal may be equal to the bandlimited signal plus a constant. The constant may be equal to an integer multiple of the modulus of the centered modulo operation employed to take the modulo samples.

18 Claims, 9 Drawing Sheets

(56) References Cited

U.S. PATENT DOCUMENTS

| | | | |
|---|---|---|---|
| 8,032,388 B1 * | 10/2011 | Luh | G10L 19/24 341/61 |
| 8,160,194 B2 | 4/2012 | Vetterli et al. | |
| 2005/0190865 A1 | 9/2005 | Lazar et al. | |

OTHER PUBLICATIONS

Ericson, T., et al., Modulo-PCM: A new source coding scheme; published in IEEE International Conference on Acoustics, Speech, and Signal Processing, ICASSP '79, Apr. 1979.

Kasuvi, S., et al., Quantitative study of high-dynamic-range image sensor architectures; published in Sensors and Camera Systems for Scientific, Industrial and Digital Photography Applications V, Proceedings of SPIE—IS&T Electronic Imaging, SPIE, vol. 5301, p. 264-275 (year 2004).

Kester, W., ADC Architectures VI: Folding ADCs, MT-025 Tutorial, Rev A, Oct. 2008; published by Analog Devices, 2008.

Rhee, J. et. al, Wide dynamic range CMOS image sensor with pixel level ADC; published in Electronics Letters, vol. 39, Issue 4, Feb. 2003.

Sasagawa, K., et al., An Implantable CMOS Image Sensor With Self-Reset Pixels for Functional Brain Imaging; published in IEEE Transactions on Electron Devices, vol. 63, Issue 1, Jan. 2016.

Yagamuchi, T., et al., Implantable self-reset CMOS image sensor and its application to hemodynamic response detection in living mouse brain; published in 2016 Japanese Journal of Applied Physics 55 04EM02.

Zhou, H., et al., Unbounded High Dynamic Range Photography Using a Modulo Camera; published in 2015 IEEE International Conference on Computational Photography (ICCP 2015).

* cited by examiner

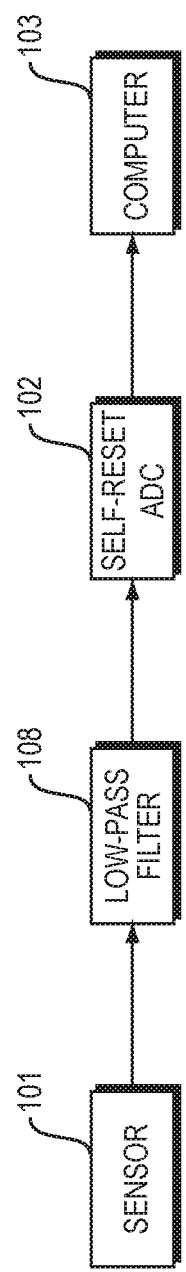
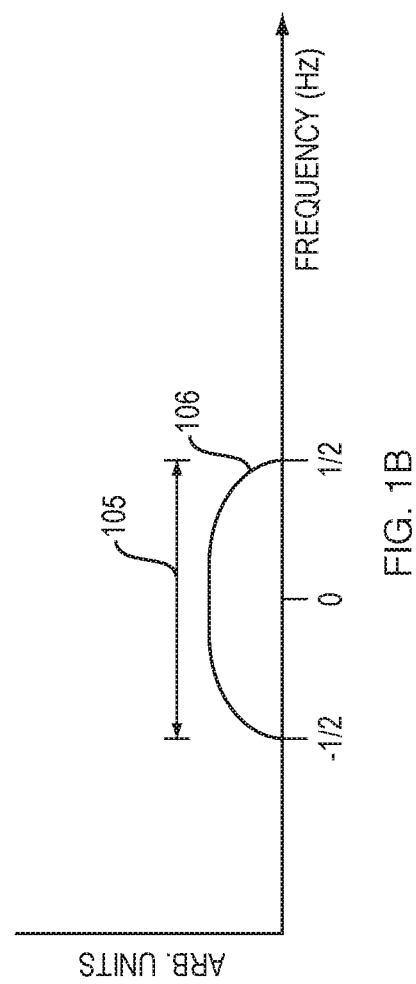

| Algorithm 1: Recovery from Modulo Folded Samples |
|---|

Data: $y_k = M_\lambda(g(kT))$, $N \in \mathbb{N}$, and $2\lambda\mathbb{Z} \ni \beta_g \geq \|g\|_\infty$.

Result: $\tilde{g} \approx g$.

1) Compute $\overline{y} = \Delta^N y$.

2) Compute $\overline{\varepsilon}_\gamma = M_\lambda(\overline{y}) - \overline{y}$. Round each element of $\overline{\varepsilon}_\gamma$ to the nearest integer. Set $s_{(1)}$ equal to this rounded $\overline{\varepsilon}_\gamma$.

3) for $n = 1 : N - 1$
   Compute $\kappa_{(n)}$.
   $s_{(n+1)} = Ss_{(n)} - 2\lambda \kappa_{(n)}$.
   Round each element of $s_{(n+1)}$ to the nearest integer.
   end 4) $\tilde{\gamma} = (Ss_{(N)})_k + y_k$.

5) Compute $\tilde{g}$ from $\tilde{\gamma}$ via low-pass filter.

METHODS AND APPARATUS FOR MODULO SAMPLING AND RECOVERY

RELATED APPLICATIONS

This application claims the benefit of U.S. Provisional Application No. 62/966,555 filed Oct. 2, 2017 (the "Provisional").

FIELD OF TECHNOLOGY

The present invention relates generally to sampling of a bandlimited signal and recovery of the signal from the samples.

COMPUTER PROGRAM LISTING

The following computer program file is incorporated by reference herein: source_code.txt with a size of about 5 KB, created as an ASCII .txt file on Jun. 21, 2018.

BACKGROUND

The Nyquist-Shannon sampling theorem may be stated as follows: For a bandlimited signal with maximum frequency of B Hz, the signal may be perfectly reconstructed from uniform samples of the signal if the samples are taken at a sampling rate that is greater than the Nyquist rate (2B samples per second).

Nyquist-Shannon sampling is often used in signal processing. For example, in many conventional sensing systems: (a) an analog sensor takes measurements of a physical phenomenon and outputs an analog electrical signal that encodes the measurements; and (b) an analog-to-digital converter (ADC) takes pointwise samples of the analog electrical signal at a sampling rate that is greater than the Nyquist rate.

Unfortunately, sampling at the Nyquist rate does not ensure accurate reconstruction of a signal if the dynamic range of the signal is too large. This is because, if the dynamic range is too large, an ordinary ADC may saturate or clip.

For example: (a) an ordinary ADC that is sampling an analog electrical signal may saturate once the input voltage reaches a saturation voltage; and (b) further increases in the input voltage (above the saturation level) may fail to produce a further increase in the sample value outputted by the ADC. Instead, for all input voltages that are at or above saturation voltage, the ADC may output substantially the same value (encoded in a digital signal).

When an ordinary ADC saturates, the resulting samples are clipped and hence the reconstruction is distorted and erroneous. The clipping is a serious problem that may manifest as non-linear artifacts in a variety of applications including audio-visual data, physiological data, or biomedical data). Clipping of bandlimited signals may result in discontinuities that comprise high-frequency distortions to the signal.

An attempted solution to the clipping problem has been to employ ADC's that effectively perform modulo operations, in such a manner that the values outputted by the ADC "wrap around" or "fold" when the input voltage reaches a certain value. Put loosely, these ADC's reset themselves when the input voltage reaches a certain value. Depending on the author and the field of endeavor, an ADC which performs modulo operations is sometimes called a folding ADC, reset ADC, self-reset ADC, SR-ADC, modulo ADC, or modulo PCM (pulse code modulator). For the remainder of this document, we shall refer to all of these as self-reset ADCs or SR-ADCs.

There has been relatively little research into how to recover an input signal from modulo samples acquired by a self-reset ADC. Conventional recovery methods that have been employed—to attempt to do this—suffer from at least two problems:

First, no one has known how to recover a bandlimited, continuous input signal from the modulo samples, in a manner that is mathematically guaranteed to recover the input signal (or that is mathematically guaranteed to recover an estimated signal that is equal to the input signal plus a constant bias signal).

Second, some conventional recovery methods for SR-ADCs have required knowledge of the number of folds that were employed to create each folded modulo sample, respectively. Thus, some conventional SR-ADCs are configured to count the number of folds. Recording the number of folds is often undesirable, because it may pose additional hardware constraints and require extra memory to store the number of folds.

SUMMARY

In illustrative implementations of this invention, a self-reset ADC may take a set of temporally equidistant, modulo samples of a bandlimited, analog signal, at a sampling rate that is greater than $\pi e$ samples per second, where $\pi$ Archimedes' constant and e is Euler's number. The bandlimited signal may have a bandwidth of 1 Hz and a maximum frequency of 0.5 Hz. These conditions of sampling rate, bandwidth and maximum frequency may ensure that an estimated signal may be recovered from the set of modulo samples. This estimated signal may be equal to the bandlimited signal plus a constant. The constant may be equal to an integer multiple of the modulus of the centered modulo operation employed to acquire the modulo samples.

Thus, in illustrative implementations, oversampling is performed, in the sense that the sampling rate (greater than $\pi e$ Hz) is much greater than the Nyquist rate (which is 1 Hz because the maximum frequency is 0.5 Hz).

Oversampling in this specific window of sampling rate (i.e., greater than $\pi e$ Hz) is very advantageous. This is because, if one performs centered modulo sampling with a sampling rate is this specific window (i.e., greater than $\pi e$ Hz), then—if the signal being sampled is an analog signal with a bandwidth of 1 Hz and a maximum frequency of 0.5 Hz,—recovery from the modulo samples is mathematically assured. A mathematical proof of this assertion is set forth later in this document.

Indeed, in illustrative use scenarios of this invention, if one oversamples by performing centered modulo sampling with a sampling rate in this specific window (i.e., greater than $\pi e$ Hz)—and if the other conditions (regarding bandwidth and maximum frequency) specified in the preceding paragraph are satisfied—then the mathematical assurance of recovery applies even in scenarios where the signal has a maximum magnitude that far exceeds half the modulus of the centered modulo operation. Furthermore, in these scenarios, mathematical assurance of recovery applies even where the signal has a maximum magnitude that far exceeds the saturation threshold at which the ADC would clip in the absence of modulo folding.

The present invention is a major improvement in the technology of sampling. Conventional sampling with an ordinary ADC at a rate slightly above the Nyquist rate does not prevent clipping due to saturation of an ordinary ADC. In contrast, in illustrative implementations of this invention: (a) centered modulo sampling avoids clipping; and (b) oversampling in this specific sampling rate window (i.e., greater than πe Hz) means that recovery is mathematically assured, if the analog signal being sampled has a bandwidth of 1 Hz and a maximum frequency of 0.5 Hz.

In illustrative implementations of this invention, the three problems identified in the Background section above are solved.

First, in illustrative implementations of this invention, the problem of clipping due to saturation in high-dynamic range contexts is avoided, by employing a self-reset ADC, instead of an ordinary ADC. The self-reset ADC may perform a centered modulo operation with a modulus of 2λ and a range of [−λ, λ). By setting λ at a value lower than the ADC saturation voltage, ADC clipping due to saturation may be avoided; and (b) the ADC may accurately record modulo samples for a domain of input voltages which extends to voltages that are much larger than the saturation voltage.

Second, in illustrative implementations of this invention, extremely accurate recovery of a bandlimited signal is mathematically assured, even for high-dynamic range signals. Specifically, in illustrative implementations, accurate reconstruction is assured under the following scenario: a self-reset ADC takes temporally equidistant, pointwise samples of a bandlimited signal, where (a) the analog signal g(t) has a bandwidth of 1 Hz and a maximum frequency of 0.5 Hz; (b) the sampling rate is greater than πe samples per second, π being Archimedes' constant and e being Euler's number; and (c) the output of the self-reset ADC comprises discrete samples of a centered modulo function $\mathcal{M}_\lambda$ (x), where the centered modulo function has a modulus of 2λ and a range of [−λ, λ) and where x=g(t). In this scenario, a computer may calculate an estimate of the analog signal, where (a) the estimate is equal to the analog signal plus a constant bias signal, and (b) the bias signal is equal to an integer multiple of the modulus. The recovery is extremely accurate, regardless of whether the bandlimited has a large dynamic range. In other words, the recovery is extremely accurate, regardless of whether the maximum amplitude of the signal is much greater than half the modulus. This recovery is mathematically guaranteed. A mathematical proof of this guarantee is set forth later in this document.

Third, in illustrative implementations of this invention, it is not necessary to count (or even estimate) the number of resets for each modulo sample, respectively. In illustrative implementations of this invention, the number of resets is not an input to the recovery algorithm. Instead, in illustrative implementations of this invention, accurate recovery may be achieved as long as two items are known: (a) the range [−λ, λ) of the centered modulo function $\mathcal{M}_\lambda$ of the self-reset ADC (this is easy to know, since λ may be a fixed system parameter of the self-reset ADC); and (b) a rough estimate of the max-norm (maximum magnitude) of the bandlimited analog signal being sampled.

In illustrative implementations of this invention, the minimum sampling rate (greater than πe samples per second) may be independent of the dynamic range of the bandlimited signal being sampled. This minimum sampling rate (greater than πe samples per second) may also be independent of the modulus of the centered modulo operation that is performed to create the modulo samples.

In illustrative implementations of this invention, the recovery method involves computing finite difference approximations of higher order derivatives (e.g., order of two or more) using forward difference operators. For example, in some implementations, the recovery method involves computing finite difference approximations of third order derivatives, of fourth order derivatives or of fifth order derivatives. For instance, in some implementations, during recovery, a computer may calculate finite difference approximations of higher order derivatives of a set of modulo samples In illustrative implementations of this invention, the recovery method leverages the fact that a residual function (and each of the residual function's n th-order derivatives) is always equal to an integer multiple of the modulus of the centered modulo function that is employed to create the modulo samples. In illustrative implementations, this residual function, which we call $\varepsilon_g$ (t), is defined as $\varepsilon_g$ (t) ≜ g(t)− $\mathcal{M}_\lambda$ (g(t)), where g(t) is the bandlimited signal being sampled and $\mathcal{M}_\lambda$ (g(t)) is the centered modulo function employed to create the modulo samples. In many implementations of this invention: (a) the centered modulo operation $\mathcal{M}_\lambda$ performed to create the modulo samples has a modulus of 2λ; and (b) the residual function $\varepsilon_g$ (t) (and each of $\varepsilon_g$ (t)'s n th-order derivatives) is always equal to an integer multiple of 2λ.

In illustrative implementations, during recovery, a computer calculates a finite difference approximation of a higher order (e.g., order 2, 3, 4, or 5) derivative of residual function $\varepsilon_g$ (t).

In illustrative implementations, during recovery, a computer iteratively applies an antidifference operator in order to recover an estimate of the bandlimited signal that was sampled. When applying the anti-difference operation, an unknown constant is evaluated.

In illustrative implementations, during recovery, at each iteration in a set of iterations, the result of a calculation is rounded to the nearest integer multiple of the modulus of the centered modulo function employed to create the modulo samples. For instance, in cases where the modulus is 2λ, at each iteration in a set of iterations, the result of a calculation is rounded to the nearest integer multiple of 2λ.

In illustrative implementations: (a) g(t)=$\mathcal{M}_\lambda$ (g(t))+$\varepsilon_g$(t), (b) the discrete sampled version of $\mathcal{M}_\lambda$ (g(t)) is known, once the sampling occurs; and (c) thus, loosely speaking, recovering g(t) boils down to recovering $\varepsilon_g$ (t) (As noted above, g(t) is the bandlimited signal being sampled, $\mathcal{M}_\lambda$ (x) is the centered modulo function employed to create the modulo samples, and $\varepsilon_g$ (t) is a residual function.)

In illustrative implementations, the fact that recovering bandlimited signal g(t) boils down to recovering residual function $\varepsilon_g$ (t)—and that $\varepsilon_g$ (t) (and each of $\varepsilon_g$ (t)'s n th-order derivatives) are always equal to an integer multiple of the modulus—is very helpful. It allows values calculated during recovery to be rounded to the nearest integer multiple of the modulus, in each iteration in a set of iterations during the recovery calculations.

In illustrative implementations, the recovery estimate is highly robust against errors that would otherwise occur, such as errors due to rounding or errors due to the fact that the finite difference operator is only an approximation. This robustness against errors enables the recovery to be extremely accurate. Indeed, in a numerical simulation performed by a prototype of this invention, the mean squared error between estimated and actual, respectively, unfolded samples of the bandlimited signal was $1.6 \times 10^{-33}$.

In illustrative implementations, this stability and robustness during recovery is due, at least in part, to the fact that the estimates of $\varepsilon_g$ (t) (and of $\varepsilon_g$ (t)'s n th-order derivatives) are, during recovery, rounded to the nearest integer multiple of the modulus.

In illustrative implementations of this invention, an estimated signal may be calculated that is equal (or substantially equal) to the original bandlimited signal plus a constant bias, which constant bias is equal to an integer multiple of the modulus.

In many implementations of this invention, the bandlimited signal being sampled is a continuous time-domain signal. Alternatively, the bandlimited signal being sampled may be a continuous function of any variable, not just time. For example, the bandlimited signal may be a function of spatial position, and the frequency of the bandlimited signal may be a spatial frequency. Also, for example, a bandlimited signal may be a function of wavelength in optical systems, or a pulse in digital communications, or a sinusoidal waveform in time-of-flight imaging.

In illustrative implementations of this invention, the values of the bandlimited signal (which is being sampled) may have any arbitrary units. For instance, the bandlimited signal may have units of electric potential (e.g., voltage), electric charge (e.g., coulombs), light intensity, power, temperature, pressure, heart rate, or magnetic field strength.

In illustrative implementations, if a bandlimited signal does not have a bandwidth of 1 Hz and a maximum frequency of 0.5 Hz, then the frequency of the signal may be normalized (e.g., by adjusting ADC sampling rate) in such a way that the sampled version of the signal is indistinguishable from what would have been measured if the bandlimited signal had a bandwidth of 1 Hz and a maximum frequency of 0.5 Hz. For instance, consider an example in which: (a) a first bandlimited signal has a bandwidth of 16 Hz and a maximum frequency of 8.0 Hz; (b) the first bandlimited signal is identical to a second bandlimited signal except that the frequencies in the first signal are 16 times larger than in the second signal; and (c) thus the second signal has a bandwidth of 1 Hz and a maximum frequency of 0.5 Hz. In this example, identical samples of the first and second signals will be obtained if the first signal is sampled at a sampling rate that is 16 times faster than the sampling rate employed for the second signal. Put differently, in this example, sampling the first signal at a sampling rate of 16x is equivalent to sampling the second signal at a sampling rate of x, because identical samples would be obtained.

In some use scenarios of this invention, frequency of a first bandlimited signal is normalized by adjusting sampling rate in such a way that the samples obtained are the same as would be obtained by sampling a normalized signal (which has a bandwidth of 1 Hz and a maximum frequency of 0.5 Hz) at a different sampling rate. In that case, an estimate of the normalized signal may be recovered from the modulo samples, in the manner described above. Furthermore, an estimate of the first, un-normalized, bandlimited signal may be recovered, by un-normalizing frequency. For instance, in the example mentioned in the prior paragraph (in which the un-normalized signal had bandwidth of 16 Hz and a maximum frequency of 8 Hz), the estimate of the un-normalized signal may be computed by multiplying frequency of the estimated normalized signal by 16.

In illustrative implementations, if an analog signal is not band-limited, it may be low-pass filtered to create a band-limited signal. Modulo samples of the band-limited signal (or of a signal derived from it, e.g., by normalizing frequency) may be taken. Then the band-limited signal (or signal derived from it) may be recovered, in the manner described above. However, in illustrative implementations, the non-bandlimited signal is not recoverable from the modulo samples.

The Summary and Abstract sections and the title of this document: (a) do not limit this invention; (b) are intended only to give a general introduction to some illustrative implementations of this invention; (c) do not describe all of the details of this invention; and (d) merely describe non-limiting examples of this invention. This invention may be implemented in many other ways. Likewise, the Field of Technology section is not limiting; instead it identifies, in a general, non-exclusive manner, a field of technology to which some implementations of this invention generally relate.

BRIEF DESCRIPTION OF THE DRAWINGS

FIG. 1A shows hardware configured for sensing a high-dynamic range signal.

FIG. 1B shows a plot of a power spectrum of a bandlimited signal, with a bandwidth of 1 Hz and a maximum frequency of 0.5 Hz.

FIG. 9 illustrates a method of recovering an estimate of a bandlimited function, from modulo samples.

Figure 2:
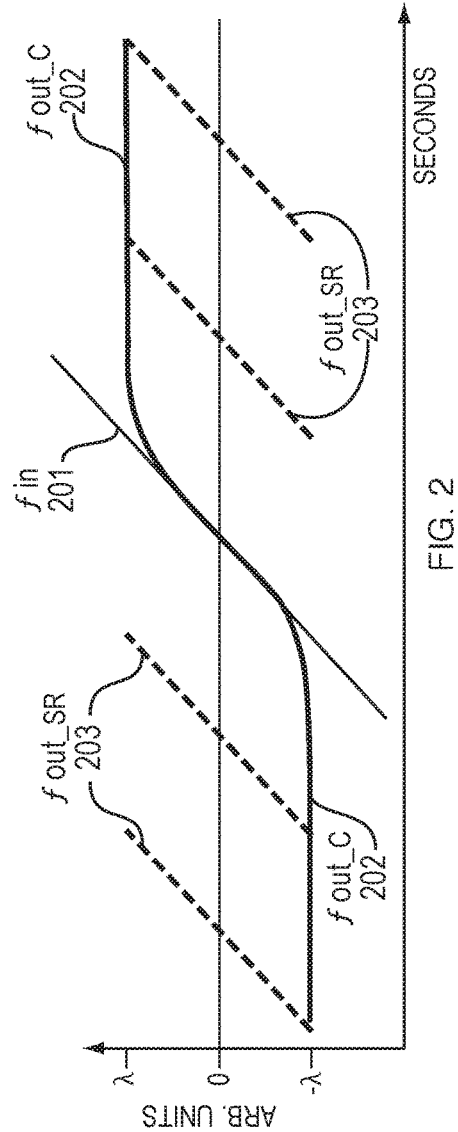
FIG. 2 illustrates clipping and how this may be avoided with a self-reset ADC.

The above Figures are not necessarily drawn to scale. The above Figures show some illustrative implementations of this invention, or provide information that relates to those implementations. The examples shown in the above Figures do not limit this invention. This invention may be implemented in many other ways.

DETAILED DESCRIPTION

Overview

In illustrative implementations of this invention, a self-reset ADC may take a set of temporally equidistant, modulo samples of a bandlimited, analog signal, at a sampling rate that is greater than $\pi e$ samples per second, where $\pi$ is Archimedes' constant and e is Euler's number. The bandlimited signal may have a bandwidth of 1 Hz and a maximum frequency of 0.5 Hz. These conditions of sampling rate, bandwidth and maximum frequency may ensure that an estimated signal may be recovered from the set of modulo samples. This estimated signal may be equal (or substantially equal) to the bandlimited signal plus a constant. The constant may be equal to an integer multiple of the modulus of the centered modulo operation employed to take the modulo samples.

As used herein, a "modulo sample" or "centered modulo sample" means a discrete sample of a centered modulo function. "Centered modulo sampling" means sampling that outputs centered modulo samples.

As used herein, a "centered modulo function", "centered modulo operation", "$\mathcal{M}_\lambda(x)$" or "$\mathcal{M}_\lambda$" means a function that, for any input $x \in \mathbb{R}$, outputs a value equal to $$2\lambda \left( \left[\left[ \frac{x}{2\lambda} + \frac{1}{2} \right]\right] - \frac{1}{2} \right),$$

where $\lambda$ is a positive real number, $[[x]] \triangleq x - \lfloor x \rfloor$ and $\lfloor \cdot \rfloor$ is the floor function. In other words, $[[x]]$ is the fractional part of x. Thus, a centered modulo function (also called $\mathcal{M}_\lambda$) has a domain of $x \in \mathbb{R}$, a modulus of $2\lambda$, and a range of $[-\lambda, \lambda)$, where $\lambda$ is a positive real number.

In some implementations of this invention, the argument of $\mathcal{M}_\lambda$ is $x = g(t)$, where t is time and $g(t)$ is a bandlimited, continuous, time-domain signal.

Note that a centered modulo function, as defined herein, is not the same as ordinary modulo function. An ordinary modulus function: (a) has a modulus of $\lambda$ and a range of $[0, \lambda)$; and (b) the output of the function "folds" (resets) to zero at each integer multiple of $\lambda$. For example, in an ordinary modulo function, if modulus is 3, then: (a) for an input of 2.9, the output of the function is 2.9; (b) for an input of 3, the output of the function is 0; (c) for an input of 3.1, the output of the function is 0.1; and (d) the range of the function is $[0,3)$.

In contrast, in a centered modulo function (as defined herein), the modulus is $2\lambda$ and the range of the function is $[-\lambda, \lambda)$. In a centered modulo function $f(x)$, the value of $f(x)$ resets to $-\lambda$ each time that x reaches $(2n+1)\lambda$, where n is an integer. Each of these resets is what is sometimes called a "fold". For instance, if a centered modulo function $u(x)$ has a modulus of $0.5 = 2\lambda$ and a range of $[-\lambda, \lambda) = [-0.25, 0.25)$, then the value of $u(x)$ would "fold" to $-0.25$ three times, at x equals 0.25, 0.75 and 1.25, respectively, while x increased monotonically from 0 to 1.6.

Also, for example, in a centered modulo function with a modulus of 2 and a range of $[-1, 1)$: (a) if the input of the function is 0.9, then the output of the function is 0.9; (b) if the input of the function is 1.0, then the output of the function is $-1.0$; (c) if the input of the function is 1.1, then the output of the function is $-0.9$; and (d) if the input of the function is $-0.9$, then the output of the function is $-0.9$.

FIG. 1A shows hardware configured for sensing a high-dynamic range signal, in an illustrative implementation of this invention. In the example shown in FIG. 1A, an analog sensor 101 may measure a physical phenomenon and output a sensor signal that comprises a continuous analog time-domain signal. A low-pass filter 108 may filter the sensor signal to produce a bandlimited signal. The frequency of the bandlimited signal may be normalized in such a way that the resulting bandlimited signal has a bandwidth of 1 Hz and a maximum frequency of 0.5 Hz The self-reset ADC 102 may take modulo samples of this resulting bandlimited signal at temporally equidistant times, with a sampling rate that is greater than $\pi e$ seconds per sample. A computer 103 may process these modulo samples, in order to recover an estimate of the continuous signal.

FIG. 1B shows a plot of a power spectrum of a bandlimited signal 106, in an illustrative implementation of this invention. Signal 106 has a bandwidth 105 of 1 Hz and a maximum frequency of 0.5 Hz.

FIG. 2 is a diagram that conceptually illustrates clipping and how this may be avoided with a self-reset ADC. In the example shown in FIG. 2, input voltage $f_{in}$ 201 of an input signal to the ADC increases monotonically. In FIG. 2, an ordinary ADC saturates at input voltage $\lambda$ and at input voltage $-\lambda$, thus voltage readings $f_{out\_C}$ 202 encoded in the signal outputted by the ordinary ADC: (a) flatten as they approach in $\lambda$ volts and do not exceed $\lambda$ volts; and (b) flatten as they approach $-\lambda$ volts and do not decrease below $-\lambda$ volts. Therefore, the output of an ordinary ADC is clipped in regions where the input voltage has a magnitude above the saturation voltage. In contrast, in FIG. 2, a self-reset ADC resets (folds) the output voltage reading $f_{out\_SR}$ 203 to $-\lambda$ volts repeatedly, as the input voltage continues to increase. Thus, the output of the self-reset ADC is not clipped. In FIG. 2, for ease of illustration, the saturation voltage is shown as being equal to $\lambda$. In many implementations of this invention, however, $\lambda$ is less than the saturation voltage. For instance, in some cases, $\lambda$ is one tenth of the saturation voltage. Furthermore, in FIG. 2, the voltage readings that are outputted by the ordinary ADC and self-reset ADC ($f_{out\_C}$ 202 and $f_{out\_SR}$ 203, respectively) each comprise a set of discrete data points (although, for ease of illustration, they appear in FIG. 2 to be continuous lines.)

In FIGS. 2, 3, 4, 6 and 7, the vertical axis has arbitrary units. These may be any unit that measures any physical parameter or other parameter. As non-limiting examples, the units of the vertical axis may be units of electric potential (e.g., voltage), electric charge (e.g., coulombs), light intensity, power, temperature, pressure, heart rate, or magnetic field strength.

In FIGS. 2, 3, 4, 6 and 7, the units of the horizontal axis are shown as seconds. However, in these Figures, the units of the horizontal axis may be any arbitrary unit. As a non-limiting example, the units of the horizontal axis may instead be units of spatial distance (e.g., meters).

Figure 3:
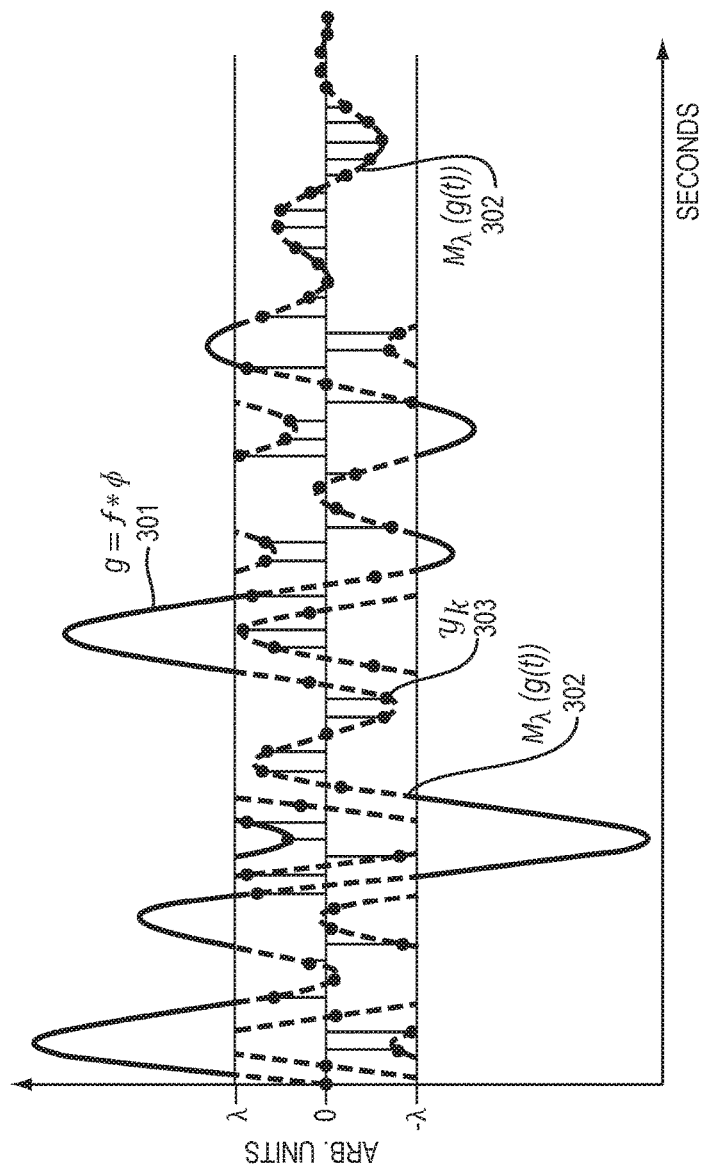
FIG. 3 illustrates centered modulo sampling.

FIG. 3 conceptually illustrates centered modulo sampling. Specifically, FIG. 3 shows a continuous, bandlimited signal $g(t) = f * \phi$, where $f$ is a continuous signal (which may be non-bandlimited), $*$ is the convolution operator, and $\phi$ is a low-pass filter (sometimes called a kernel). Thus, in FIG. 3, bandlimited signal $g(t)$ 301 may result from low-pass filtering a continuous signal $f$. FIG. 3 also shows signal $\mathcal{M}_\lambda(g(t))$ 302, which is a centered modulo version of signal $g(t)$ 301. Furthermore, FIG. 3 shows samples $y_k$ (e.g., sample 303) which are discrete, uniform samples of $\mathcal{M}_\lambda(g(t))$ 302. Thus, in FIG. 3, samples $y_k$ are discrete, uniform samples of a centered modulo version of signal $g(t)$.

Figure 4:
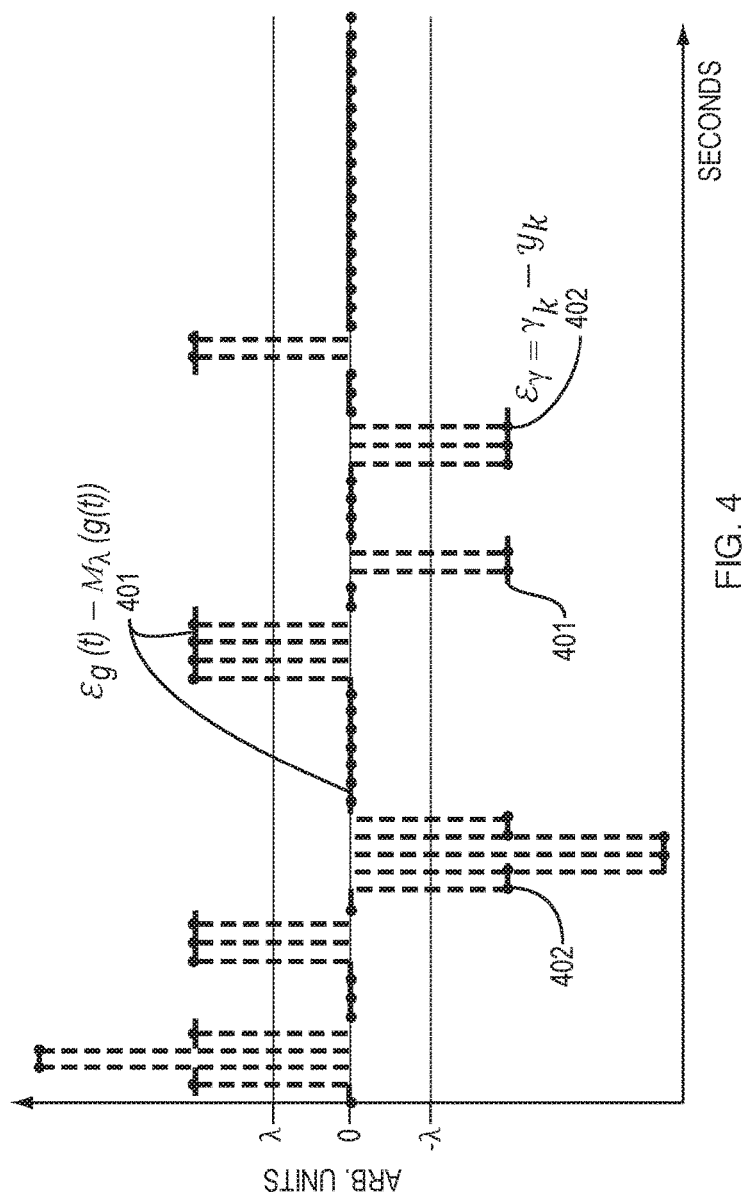
FIG. 4 illustrates a residual function

FIG. 4 conceptually illustrates a residual function. In FIG. 4, a residual function 401 is $\varepsilon_g(t) = g(t) - \mathcal{M}_\lambda(g(t))$. FIG. 4 also shows a sampled version of residual function 401. This sampled version 402 is $\varepsilon_\gamma = \gamma_k - y_k$, where $\gamma_k$ comprises samples of $g(t)$ and where $y_k$ comprises samples of $\mathcal{M}_\lambda(g(t))$.

In FIG. 4, residual function $\varepsilon_g(t)$ takes on only values that are equal to integer multiples of $2\lambda$. Likewise, the derivatives of $\varepsilon_g(t)$ (including the first order derivative and higher order derivatives) each take on only values that are equal to integer multiples of $2\lambda$.

In FIG. 4, residual function 401 comprises a sum of box functions, where each "box" occurs in an interval of time during which the value of the residual function (in the vertical axis) is constant and non-zero.

Figure 5:
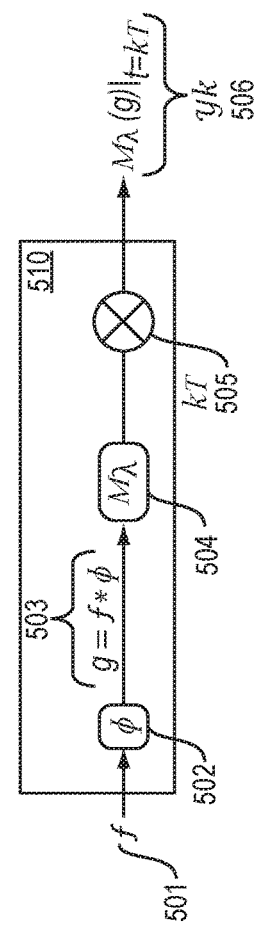
FIG. 5 also illustrates centered modulo sampling.

FIG. 5 conceptually illustrates a process 510 of centered modulo sampling. In the example shown in FIG. 5, a low-pass filter (symbolized by kernel $\phi$ in FIG. 5) 502 filters a non-bandlimited signal 501 to produce a bandlimited signal $g(t)$ 503, where $g(t) = f(t) * \phi$. A self-reset ADC takes discrete samples every T seconds (step 505) of a centered modulo version $\mathcal{M}_\lambda$ 504 of bandlimited function $g(t)$ 503.

The self-reset ADC outputs $y_k$ 506 which is a sampled version of $\mathcal{M}_\lambda$ (g(t)), where the samples are taken every T seconds.

Figure 6:
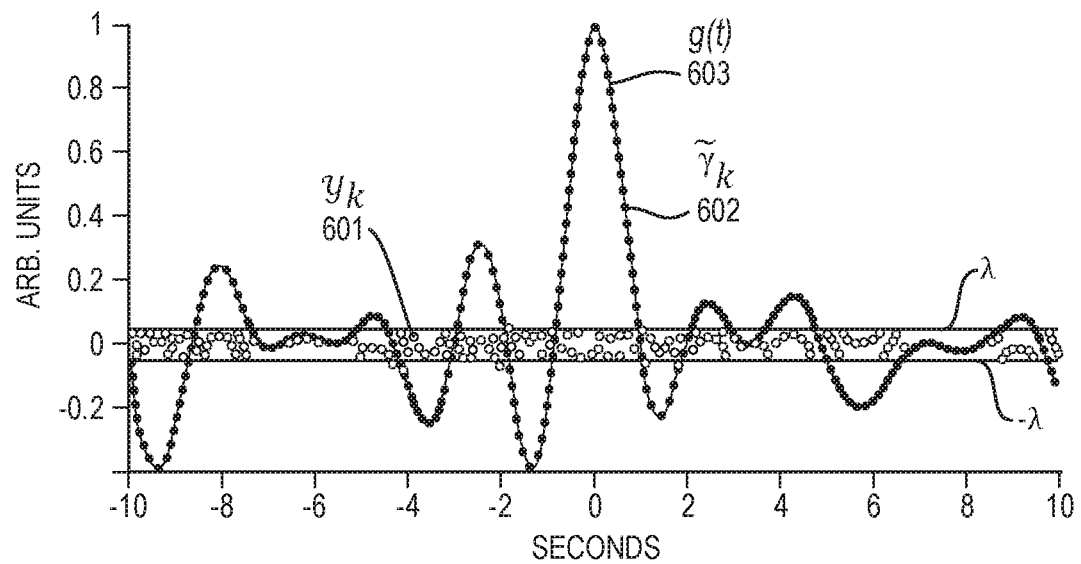
FIGS. 6 and 7 illustrate results achieved by a prototype of this invention, when recovering a signal from modulo samples.
Figure 7:
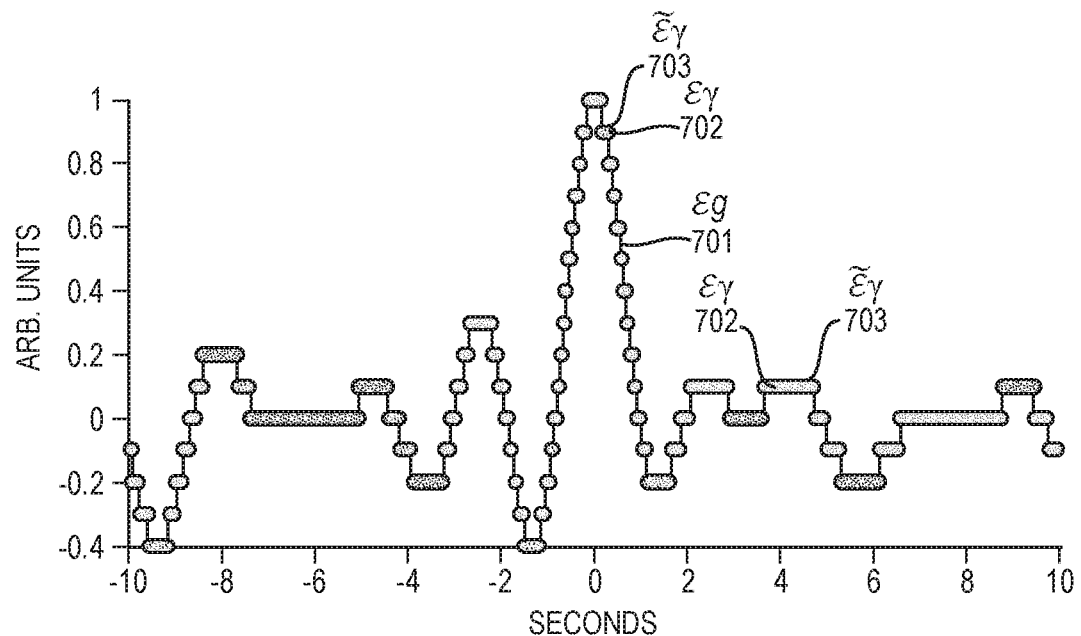

Two more definitions, before we discuss FIGS. 6 and 7.

As used herein, "$B_\pi$" means a bandlimited signal that has a Fourier transform that is zero for all frequencies outside of the frequency band (in radians) $[-\pi, \pi]$—or equivalently, outside of the frequency band (in Hertz) of $[-0.5, 0.5]$.

As used herein, a tilde over a value means that the value is estimated. For example, $\tilde{\varepsilon}_g$ and $\tilde{\gamma}_k$ are estimates of $\varepsilon_g$ and $\gamma_k$, respectively.

FIGS. 6 and 7 illustrate results achieved by a prototype of this invention, when recovering a signal from modulo samples.

Specifically, FIGS. 6 and 7 illustrate results from the following numerical simulation, which was performed by a prototype of this invention. In this simulation, a signal $g \in B_\pi$ is generated multiplying the Fourier spectrum of the sinc-function with weights drawn from the standard uniform distribution, and then re-scaling g so that the max-norm of g is 1. In this simulation, signal g is centered modulo sampled with $\lambda = 1/20$ and the sampling rate is greater than $\pi e$ samples per second. This sampling results in modulo samples $y_k$. This is shown in FIG. 6. A computer performs Algorithm 1 (described below and in FIG. 9) with N=5, rounding to the nearest multiple of $2\lambda$ for stability. The computer thus reconstructs samples $\tilde{\gamma}_k$ as well as $\tilde{\varepsilon}_g$ as shown in FIG. 6.

For this numerical simulation, FIG. 6 plots bandlimited signal g(t) 603. Furthermore, FIG. 6 plots modulo samples $y_k$ of bandlimited signal g(t) (e.g., modulo sample 601). Also, FIG. 6 plots $\tilde{\gamma}_k$ (including sample 602), where $\tilde{\gamma}_k$ comprises estimated unfolded discrete samples of g(t) that are calculated during recovery.

For this numerical simulation, FIG. 7 plots the continuous time residual function $\varepsilon_g$ (t) 701, where $\varepsilon_g$ (t)=g(t)−y(t), and where y(t) is the centered modulo version of g(t). Furthermore, FIG. 7 plots $\varepsilon_\gamma$ 702, which is the discrete, sampled version of $\varepsilon_g$ (t) 701. Also, FIG. 7 plots $\tilde{\varepsilon}_\gamma$ 703, which is an estimate of $\varepsilon_\gamma$ 702. This estimate $\tilde{\varepsilon}_\gamma$ 703 was estimated during recovery of the signal.

In the numerical simulation that is the subject of FIGS. 6 and 7, the mean squared error between $\gamma_k$=g(kT) and the reconstructed samples, $\tilde{\gamma}_k$, was $1.6 \times 10^{-33}$. This mean squared error appears to be due to, loosely speaking, rounding imprecision in Matlab® software.

Example: Taking Modulo Samples and Recovering Signal

The following 31 paragraphs describe a method of centered modulo sampling and signal recovery, in an illustrative implementation of this invention. Specifically, the following 29 paragraphs describe a method that involves (a) a self-reset ADC taking modulo samples $\mathcal{M}_\lambda$ (g(t)) of a continuous signal g(t); and (b) a computer recovering, from these samples, an estimate that is equal to the continuous signal g(t) plus a constant, where the constant is equal to an integer multiple of $2\lambda$. This method includes at least the following ten steps (Steps 1-10):

Step 1: Modulo Samples $y_k$.

First, acquire a set of modulo samples $y_k$. This is done as follows:

The signal that is sampled is a bandlimited, analog signal g(t). This bandlimited signal has a bandwidth of 1 Hz and a maximum frequency of 0.5 Hz. A self-reset ADC takes modulo samples of bandlimited signal g(t), in such a way that: (a) the sampling rate is greater than $\pi e$ samples per second, $\pi$ being Archimedes' constant and e being Euler's number; and (b) the samples are temporally equidistant. The sampling may be performed without counting, recording or computing folds.

The self-reset ADC outputs a set of modulo samples $y_k$, where k is an integer. The set of modulo samples $y_k$ consists of temporally equidistant, pointwise samples of centered modulo function $\mathcal{M}_\lambda$ (g(t)), where $\mathcal{M}_\lambda$ (g(t)) has a modulus of $2\lambda$ and a range of $[-\lambda, \lambda]$. The set of modulo samples $y_k$ may be acquired by impulse modulation of $\mathcal{M}_\lambda$ (g(t)), the impulses being uniformly spaced in time.

In this example, the remaining steps (Step 2 to Step 10) comprise a recovery method. The recovery involves recovering, from the set of modulo samples $y_k$, an estimate of the bandlimited signal g(t).

Step 2: Max-Norm.

Estimate (at least roughly) the maximum magnitude of the bandlimited, analog signal g(t). This maximum magnitude is sometimes referred as the "max-norm" of signal g(t), and is sometimes mathematically symbolized by $\|g\|_\infty$. For example, this (at least rough) estimate of the max-norm of signal g(t) may be based on previous sensor measurements.

Step 3: Upper Bound $\beta_g$:

Then determine upper bound $\beta_g$, which is the smallest integer multiple of $2\lambda$, that is greater than or equal to the estimated max-norm $\|g\|_\infty$. For example, if the estimated max-norm of g(t) is 12.2 and $\lambda$ is 1.5, then $\beta_g$=15.

Step 4: N, the Order of Finite Difference.

Then determine a natural number N. This number N is the order of finite difference that will be used in the recovery. Specifically, $$N = \left\lceil \frac{\log\lambda - \log\beta_g}{\log(T\pi e)} \right\rceil \quad \text{(Equation A)}$$

where T is the sampling interval, where e is Euler's number, e≈2.172; and where $\lceil \cdot \rceil$ is the ceiling function.

As noted in Step 1, the sampling rate for this algorithm is greater than $\pi e$ samples per second. Thus, sampling interval T for this algorithm is less than $(\pi e)^{-1}$ seconds per sample.

Step 5: $\bar{y}$, the Finite Difference Approximation of the Nth Order Derivative of Sequence $y_k$.

Compute $\bar{y}$, which is the finite difference approximation of the Nth order derivative of sequence $y_k$. This finite difference approximation uses a finite forward difference. To compute $\bar{y}$, use the formula $$\bar{y} = (\Delta^N y)_k = \sum_{n=0}^{N} (-1)^n \binom{N}{n} y_{k+(N-n)} \quad \text{(Equation B)}$$

where $\Delta^N$ is the finite difference operator, n! is the factorial of n, and $$\binom{N}{n}$$

denotes the binomial coefficient given by $$\binom{N}{n} = \frac{N!}{n!(N-n)!}$$

For instance, with N=1, 2, and 3, respectively, we have $$N=1, (\Delta^1_y)_k = y_{k+1} - y_k$$

$$N=2, (\Delta^2_y)_k = y_{k+2} - 2y_{k+1}y_0$$

$$N=3, (\Delta^3_y)_k = y_{k+3} - 3y_{k+2} + 3y_{k+1} - y_0.$$

Step 6: Residual Function $\bar{\varepsilon}_\gamma$.

Compute residual function $\bar{\varepsilon}_\gamma$, which is a sequence of numbers. Specifically, compute $$\bar{\varepsilon}_\gamma = \underline{\mathcal{M}_\lambda(\bar{y}) - \bar{y}}.$$
$$\phantom{\bar{\varepsilon}_\gamma = }s^{[1]}$$

Step 7: Rounding.

Round each element in the sequence $\bar{\varepsilon}_\gamma$ to the nearest integer multiple of $2\lambda$. Call this rounded sequence $s^{[1]}$ Step 8: Sequence $s^{[N]}$.

Compute sequence $s^{[N]}$ where N is given by Equation A above. Sequence $s^{[N]}$ may be computed iteratively, using a "for loop", as follows:

For each n=1, . . . , N−1 in steps or increments of 1,
substep (a): compute integer constant $\kappa_{(n)}$
substep (b): compute $s^{[n+1]} = Ss^{[n]} - 2\lambda\kappa_{(n)}$
substep (c): round each element in the sequence $s^{[n+1]}$ to the nearest integer multiple of $2\lambda$
end In each iteration of this "for loop", the integer constant $\kappa_{(n)}$ is computed as follows:

$$\kappa_{(n)} = \left\lfloor \frac{X_1 - X_{J+1}}{8\beta_g} + \frac{1}{2} \right\rfloor, \quad \text{(Equation C)}$$

where
(a) $\lfloor \cdot \rfloor$ is the floor function,
(b) $J=6\beta_g/\lambda$, and
(c) $\{X\}_k$ is a sequence of numbers with $$X_k = (S^2 s^{[n]})_k \quad \text{(Equation D)}$$

For initialization, at n=1, $s^{[1]} = \bar{\varepsilon}_\gamma$ is given in Step 7, and thereafter, $s^{[2]}, s^{[3]}, \ldots$ are computed using substep (c) in this Step 8. In Equation D, S is an anti-difference operator given by, $$S: (b_l)_{l=1}^\infty \rightarrow (\Sigma_{m=1}^l b_m)_{l=1}^\infty,$$

Note that $S\Delta f(x)) = f(x) + c_0$, where $c_0$ is some unknown, real-valued constant, which in this case is an integer-valued constant $\kappa_{(n)}$ identified by calculating $\kappa_{(n)}$ per Equation C above. S is the first-order anti-difference operator. $S^2$ is the second-order anti-difference operator.

Note that the final iteration of the "for loop" in this Step 8 is for n=N−1. Thus, the output of this Step 8 is sequence $s^{[N]}$.

Step 9: unfolded samples $\tilde{\gamma}$.

Estimate unfolded samples $\tilde{\gamma}$. These estimated discrete samples $\tilde{\gamma}$ are an estimate of g(kT). As noted above, g (kT) is the set of discrete samples obtained by sampling g(t) every T seconds.

In this Step 9, samples $\tilde{\gamma}$ may be estimated by $\tilde{\gamma} = (Ss^{[N]}) + \gamma_k$. As mentioned above, $s^{[N]}$ is the output of Step 7.

Note that $Ss^{[N]} = \varepsilon_\gamma + c_0$. That is, $Ss^{[N]}$ is equal to residual function $\varepsilon_\gamma$ plus some unknown bias $c_0 = 2\lambda n$, where n is an integer. As noted above, $\varepsilon_\gamma = \gamma_k - y_k$, where $\gamma_k$ comprises samples of g(t) and where $y_k$ comprises modulo samples of $\mathcal{M}_\lambda$ (g(t)). In illustrative implementations, to recover samples $\gamma$, the recovery algorithm may add modulo samples $\gamma_k$ and residual function $\varepsilon_\gamma$.

Step 10: estimate of continuous function g(t).

Recover an estimate $\tilde{g}(t)$ of the bandlimited, continuous function g(t). This estimate may be computed by using Shannon's interpolation formula, $$\tilde{g}(t) = \sum_{k \in \mathbb{Z}} \tilde{\gamma}_k \text{sinc}(t - k)$$

where t is real-valued time and $$\text{sinc}(t) = \frac{\sin(\pi t)}{\pi t}.$$

In illustrative implementations of this invention, this estimate $\tilde{g}(t)$ is mathematically guaranteed to be equal to the bandlimited function g(t) plus a constant, which constant is an integer multiple of the modulus.

Figure 8:
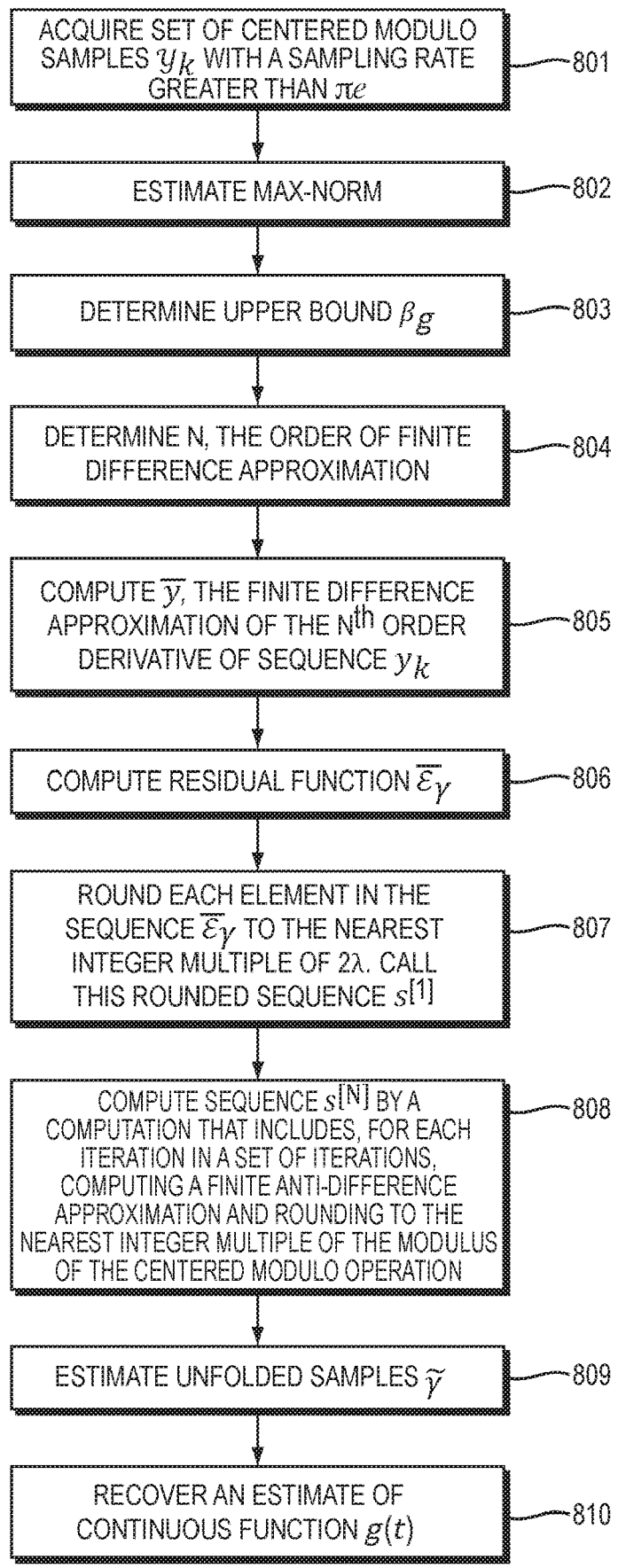
FIG. 8 is a flowchart that illustrates a method of: (a) taking modulo samples of a bandlimited function; and (b) recovering, from the samples, an estimate of the bandlimited function.

FIG. 8 is a flowchart that illustrates a method of: (a) taking modulo samples of a bandlimited function; and (b) recovering, from the samples, an estimate of the bandlimited function. In FIG. 8, the method comprises at least the ten steps (Steps 1-10) which are described above. Steps 801, 802, 803, 804, 805, 806, 807, 808, 809, and 810 of FIG. 8 summarize (and may implemented in the manner described in) steps 1, 2, 3, 4, 5, 6, 7, 8, 9, and 10, respectively, which are described above.

The preceding 31 paragraphs describe (and FIG. 8 summarizes) a non-limiting example of this invention. This invention may be implemented in many other ways. Among other things, in some implementations of this invention, other sampling methods may be employed or other recovery method may be employed.

The ten steps described above (Steps 1-10) assume that the bandlimited signal being sampled is a continuous time-domain signal. Alternatively, in Steps 1-10, the bandlimited signal being sampled may be a continuous function of any variable, not just time. In that case, Steps 1-10 shall be modified as appropriate to apply to the variable(s) in the argument of the bandlimited signal. For instance, if the bandlimited signal g(t) being sampled is a function of spatial position, then: (a) t would be spatial position instead of time; (b) the frequency of the bandlimited signal would be a spatial frequency; and (c) in Step 1, the impulses would be separated by uniform spatial distance, instead of by uniform temporal distance.

In illustrative implementations of this invention, the values of the bandlimited signal (which is being sampled) may have any arbitrary units. For instance, the bandlimited signal may have units of electric potential (e.g., voltage), electric charge (e.g., coulombs), light intensity, power, temperature, pressure, heart rate, or magnetic field strength.

Mathematical Proof of Recovery

The following 55 paragraphs comprise a mathematical proof of guaranteed recovery, in illustrative implementations of this invention.

Many self-reset ADCs employ a memoryless, non-linear mapping of the form, $$\mathcal{M}_\lambda : t \mapsto 2\lambda \left( \left[\left[ \frac{t}{2\lambda} + \frac{1}{2} \right]\right] - \frac{1}{2} \right), \quad \text{(Equation 1)}$$

where $[[t]] \triangleq t - \lfloor t \rfloor$ defines the fractional part of t.

The mapping in Equation 1 is folding amplitudes, that is, the range of $\mathcal{M}_\lambda$ is $[-\lambda, \lambda]$. In effect, Equation 1 may be interpreted as a centered modulo operation.

Let $f \in L_2$ be the function to be sampled and let $\phi$ be the sampling kernel. Let $L_2$ be the set of square-integrable functions. Let $\hat{\phi}(\omega) = \int \phi(t) e^{-j\omega t} dt$ denote the Fourier Transform of $\phi$. We say $\phi$ is $\Omega$-bandlimited or, $$\phi \in B_\Omega \Leftrightarrow \hat{\phi}(\omega) = 1_{[-\Omega,\Omega]}(\omega)\hat{\phi}(\omega) \text{ and } \phi \in L_2$$

where $1_D$ (t) is the indicator function on domain $\mathcal{D}$. In practice, $f$ may be non-bandlimited, in which case, pre-filtering with $\phi \in B_\Omega$ ensures that the signal to be sampled is bandlimited. In the remainder of this proof, we will assume that we are given a low-pass filtered version of $f$, which we will refer to as $g \triangleq f * \phi$. Furthermore, we will normalize the maximum frequency to $\pi$ (and the bandwidth to $2\pi$) such that $g \in B_\pi$. This function g then undergoes a non-linear, amplitude folding defined in Equation 1 and results in, $$z(t) = \mathcal{M}_\lambda(g(t)) \quad \text{(Equation 2)}$$

The output of Equation 1, that is, $\mathcal{M}_\lambda$ (g(t)) is sampled using impulse-modulation, $\otimes_{kT} \triangleq \sum_{k \in \mathbb{Z}} \delta(t-kT)$, where $T > 0$ is the sampling interval. This results in uniform samples, $$y_k \triangleq z(kT) = \mathcal{M}_\lambda(g(t)), k \in \mathbb{Z} \quad \text{(Equation 3)}$$

Proposition 1:

(Modular Decomposition) Let $g \in \beta_\pi$ be a zero-mean function and $\mathcal{M}_\lambda$ (g(t)) be defined in Equation 1 with $\lambda$ fixed, non-zero constants. Then, the bandlimited function g admits a decomposition $$g(t) = z(t) + \varepsilon_g(t) \quad \text{(Equation 4)}$$

where $\varepsilon_g$ is a simple function and where $\varepsilon_g$ (t) = $2\lambda \sum_{\ell \in \mathbb{Z}} q_\ell 1_{D_\ell}$ (t), $\mathbb{Z} \in q_\ell$. The function $\varepsilon_g$ (t) is a sum of box functions that takes only values that are equal to an integer multiple of $2\lambda$. Each constant sequence $\ell$ is a portion of $\varepsilon_g$ (t) in which $\varepsilon_g$ (t) is constant and non-zero (in other words, loosely speaking, each constant sequence $\ell$ is a "box"). For each constant sequence $\ell$, $2\lambda q_\ell$ is the constant value (along the $\varepsilon_g$ (t) axis) of the sequence. Thus, loosely speaking, $2\lambda q_\ell$ is the constant height of a box (which constant height may be zero or non-zero). For each constant sequence $\ell$, $\mathcal{D}_\ell$ is the width (along the horizontal t axis) of the sequence.

The proof of Proposition 1 is set forth later in this section. What Equation 4 shows is that recovering g from z boils down to finding $\varepsilon_g$. Next, we explore sufficiency conditions for recovery of g given modulo-samples $\{y_k\}_k$.

Below, we concretely answer the following questions:

Let $g \in \beta_\pi$ and suppose that we are given modulo samples of g defined by $y_k$ in Equation 3, Q1: What are the conditions for recovery of g from $y_k$?

Q2: In the spirit of Shannon's sampling theorem, is there a constructive algorithm that maps samples $y_k \rightarrow g$?

In what follows, we will answer the two questions affirmatively.

Given the sequence of modulo samples $y_k$, our basic strategy will be to apply a higher order finite difference operator $\Delta^N$, where the first order finite difference $\Delta$ is given by $(\Delta y)_k = y_{k+1} - y_k$. We will be exploiting that such operators commute with the modulo operation. So after applying the amplitude folding (Equation 1) to the resulting sequence, one obtains the same output as if one had started with $g_k$ instead of $y_k$. That in turn will allow for recovery if the higher order finite differences of the $g_k$'s are so small that the amplitude folding has no effect.

Consequently, our goal will be to investigate when higher order finite differences of samples of a bandlimited function are small enough. One way to ensure this is to sufficiently oversample. A first step towards this goal will be to relate the sample finite difference and the derivative of a bounded function. This well-known observation is summarized in the following lemma:

Lemma 1:

For any $g \in C^m$ ($\mathbb{R}$) $\cap L_\infty$ ($\mathbb{R}$), its samples $\gamma_k \triangleq g(kT)$ satisfy $$\|\Delta^N \gamma\|_\infty \leq T^N e^N \|g^{(n)}\|_\infty \quad \text{(Equation 5)}$$

where $\mathbb{R}$ is the set of real numbers, $C^m$ is a function that is differentiable m times, and $L_\infty$ is a function that has a maximum bound.

To bound the right hand side of Equation 20 (below), we invoke Bernstein's inequality, $$\|g^{(N)}\|_\infty \leq \pi^N \|g\|_\infty \quad \text{(Equation 6)}$$

Consequently, by combining Equation 20 and Equation 6, we obtain, $$\|\Delta^N \gamma\|_\infty \leq (T\pi e)^N \|g\|_\infty \quad \text{(Equation 7)}$$

This inequality may be used in our proposed recovery method. Namely, provided $$T < \frac{1}{\pi e},$$

choosing N logarithmically in $\|g\|_\infty$ ensures that the right hand side of Equation 7 is less than $\lambda$. More precisely, assuming that some $\beta_g \in 2\lambda \mathbb{Z}$ is known with $\|g\|_\infty \leq \beta_g$, a suitable choice is $$N = \left\lceil \frac{\log \lambda - \log \beta_g}{\log(T\pi e)} \right\rceil \quad \text{(Equation 8)}$$

For the remainder of this proof we will work with this choice of N and assume $$T \leq \frac{1}{2\pi e},$$

which yields the assumption in a stable way.

The bound of $\lambda$ for Equation 7 in turn entails that the folding operation has no effect on $\Delta^N \gamma$, that is, $$\bar{\gamma} \triangleq \Delta^N \gamma = \mathcal{M}_\lambda(\bar{\gamma}) = \mathcal{M}_\lambda(\bar{\gamma}) \quad \text{(Equation 9)}$$

Equation 9 allows for recovery of $\bar{\gamma}$, as the right hand side can be computed from the folded samples y. Here, the last equality in Equation 9 follows by applying the following standard observation to $$a = \gamma - \frac{1}{2}.$$

Proposition 2:

For any sequence a it holds that $$\mathcal{M}_\lambda(\Delta^N a) = \mathcal{M}_\lambda(\Delta^N(\mathcal{M}_\lambda(a))). \quad \text{(Equation 10)}$$

To choose N, we employ some upper bound $\beta_g$ such that $\|g\|_\infty \leq \beta_g$, which we assume to be available for the remainder of this proof. As it simplifies the presentation, we assume without loss of generality that $\beta_g \in 2\lambda \mathbb{Z}$ Z. Note that $\beta_g$ is used for recovery, not sampling. In illustrative implementations of this invention, no limitations on $\beta_g$ arise from the circuit architecture.

To recover the sequence $\gamma$, recall from Proposition 1 that $\varepsilon_\gamma \triangleq \gamma - y$, that is, the sampled version of $\varepsilon_g$ takes as values only multiples of $2\lambda$. As y is observed, finding $\varepsilon_\gamma$ is equivalent to finding $\gamma$.

Noting that $\bar{\varepsilon}_\gamma \triangleq \Delta^N (\gamma - y)$ can be computed from the data (via Equation 9), it remains to investigate how E can be recovered from $\bar{\varepsilon}_\gamma = \Delta^N \varepsilon_\gamma$. Due to the massive restriction on the range of all $\Delta^n \varepsilon_\gamma$, this problem is considerably less ill-posed than the problem of recovering $\gamma$ from $\Delta^N \gamma$. In particular, repeatedly applying the summation operator $$S : (a_i)_{i=1}^\infty \mapsto \left( \sum_{i'=1}^{i} a_{i'} \right)_{i=1}^\infty,$$

the inverse of the finite difference, is a stable procedure because in the implementation we can round to the nearest multiple of $2\lambda$ in every step.

There still is, however, an ambiguity to be resolved. Namely, the constant sequence is in the kernel of the first order finite difference, so its inverse can only be calculated up to a constant. Thus when computing $\Delta^{n-1} \varepsilon_\gamma$ from $\Delta^n \varepsilon_\gamma$, n=1, . . . , N, the result can be determined up to an integer multiple of the constant sequence $\ell$ with value $2\lambda$, that is, $$\Delta^{n-1}\varepsilon_\gamma = S\Delta^n\varepsilon_\gamma + \kappa_{(n)} \ell,$$

for some $\kappa_{(n)} \in \mathbb{Z}$.

For n=1, this ambiguity cannot be resolved, as adding multiples of $2\lambda$ to a function results in the same modulo samples. To resolve this ambiguity for n>1, we apply the summation operator a second time. Repeating the same argument, we obtain that $$\Delta^{n-2}\varepsilon_\gamma = S^2\Delta^n\varepsilon_\gamma + L\kappa_{(n)} + \kappa_{(n-1)} \ell \quad \text{(Equation 11)}$$

where $L = S\ell = (2\pi i)_{i=1}^\infty$.

This now implies that $$(S^2\Delta^n\varepsilon_\gamma)_1 - (S^2\Delta^n\varepsilon_\gamma)_{J+1} = \quad \text{(Equation 12)}$$
$$(\Delta^{n-2}\varepsilon_\gamma)_1 - (\Delta^{n-2}\varepsilon_\gamma)_{J+1} + 2\lambda\kappa_{(n)}J =$$
$$(\Delta^{n-2}\gamma)_1 - (\Delta^{n-2}\gamma)_{J+1} - (\Delta^{n-2}y)_1 - (\Delta^{n-2}y)_{J+1} +$$
$$2\lambda\kappa_{(n)}J \in 2\lambda\kappa_{(n)}J + (2(T\pi e)^{n-2}\beta_g + 2^{n-1}\lambda)[-1, 1] \subseteq$$
$$2\lambda J \left[ \kappa_{(n)} - \frac{\beta_g}{\lambda J} - \frac{2^{n-2}}{J}, \kappa_{(n)} + \frac{\beta_g}{\lambda J} + \frac{2^{n-2}}{J} \right]$$

Equation 12 uses Equation 7 together with the fact that $\|y\|_\infty \leq 2$. As $n \leq N$, Equation 8 yields that $$2^{n-1} \leq 2^{N-1} \leq \frac{\beta_g}{\lambda}^{-\frac{1}{\log_2(T\pi e)}} \leq \frac{\beta_g}{\lambda} \quad \text{(Equation 13)}$$

The last step of Equation 13 uses that $$T \leq \frac{1}{2\pi e}.$$

So one obtains $$(S^2\Delta^n\varepsilon_\gamma)_1 - (S^2\Delta^n\varepsilon_\gamma)_{J+1} \in 2\lambda J \left[ \kappa_{(n)} - \frac{3\beta_g}{2\lambda J}, \kappa_{(n)} + \frac{3\beta_g}{2\lambda J} \right]$$

Choosing $$J = \frac{6\beta_g}{\lambda}$$

directly yields that $$\kappa_{(n)} = \left\lfloor \frac{(S^2\Delta^n\varepsilon_\gamma)_1 - (S^2\Delta^n\varepsilon_\gamma)_{J+1}}{8\beta_g} + \frac{1}{2} \right\rfloor \quad \text{(Equation 14)}$$

We now formulate a recovery method, Algorithm 1. Algorithm 1 comprises five steps, as described below.

---

Algorithm 1: Recovery from Modulo Folded Samples

Data: $y_k = \mathcal{M}_\lambda(g(kT)), N \in \mathbb{N}$, and $2\lambda\mathbb{Z} \ni \beta_g \geq \|g\|_\infty$.
Result: $\tilde{g} \approx g$
(Step 1) Compute sequence $\bar{y} = \Delta^N y$.
(Step 2) Compute sequence $\bar{\varepsilon}_\gamma = \mathcal{M}_\lambda(\bar{y}) - \bar{y}$. Round each element of sequence $\bar{\varepsilon}_\gamma$ to the nearest integer multiple of $2\lambda$. Call the rounded sequence $s_{(1)}$.
(Step 3) for n = 1: N − 1
 (substep 3a) Compute $\kappa_{(n)}$ in Equation 14.
 (substep 3b) Compute $s_{(n+1)} = Ss_{(n)} + 2\lambda\kappa_{(n)}$
 (substep 3c) Round each element of $s_{(n+1)}$ to nearest integer multiple of $2\lambda$.
end

---

(Step 4) $\tilde{\gamma} = (Ss^{[N]})_k + y_k$. Note that $s^{[N]}$ is the output of Step 3. Note also that $Ss^{[N]} = \varepsilon_\gamma + c_0$. That is, $Ss^{[N]}$ is equal to residual function $\varepsilon_\gamma$ plus some unknown bias $c_0 = 2\lambda\mathbb{Z}$. As noted above, $\varepsilon_\gamma = \gamma_k - \gamma_k$, where $\gamma_k$ comprises samples of $g(t)$ and $y_k$ comprises modulo samples of $\mathcal{M}_\lambda(g(t))$. In illustrative implementations, to recover samples $\gamma$, the recovery algorithm may add modulo samples $y_k$ and residual function $\varepsilon_\gamma$.

(Step 5) Compute $\tilde{g}$ from $\tilde{\gamma}$ via low-pass filter.

Theorem 1 (Unlimited Sampling Theorem)

Let $g(t) \in B_\pi$ and $y_k = \mathcal{M}_\lambda g(t)|_{t=kT}$, $k \in \mathbb{Z}$ in Equation 3 be the modulo samples of $g(t)$ with sampling interval T. Then a sufficient condition for recovery of $g(t)$ from the $\{y_k\}_k$ up to additive multiples of $2\lambda$ is that $$T < \frac{1}{\pi e} \quad \text{(Equation 15)}$$

Provided that this condition is met and assuming that $\beta_g \in 2\lambda\mathbb{Z}$ is known with $\|g\|_\infty \leq \beta_g$, then choosing $$N = \left\lceil \frac{\log\lambda - \log\beta_g}{\log(T\pi e)} \right\rceil \quad \text{(Equation 16)}$$

yields that $(T\pi e)^N \|g\|_\infty < \lambda$ and Algorithm 1 recovers g from y again up to the ambiguity of adding multiples of $2\lambda$.

Proof of Proposition 1:
Since $z(t) = \mathcal{M}_\lambda\, g(t)$, by definition, we write, $$\varepsilon_g(t) \stackrel{(4)}{=} g(t) - \mathcal{M}_\lambda(g(t)) \stackrel{(a)}{=} 2\lambda(h(t) - \llbracket h(t) \rrbracket) \stackrel{(b)}{=} 2\lambda \lfloor h(t) \rfloor,$$ (Equation 18)

where (a) is due to $(g/2\lambda)+\frac{1}{2} \mapsto h$ and in (b), we use $h = \llbracket h \rrbracket + \lfloor h \rfloor$.

Since $\lfloor h \rfloor$, for an arbitrary function h, can be written as, $$\lfloor h(t) \rfloor = \sum_{\ell \in \mathbb{Z}} q_\ell 1_{\mathcal{D}_\ell}(t), q_\ell \in \mathbb{Z}$$ (Equation 19)

we obtain the desired result.

Proof of Lemma 1:
Using Taylor's theorem, we can express g(t) locally around an anchor point τ as the sum of a polynomial of degree N−1 and a remainder term of the form $$r_l = \frac{g^{(N)}(\xi_l)}{N!}(lT - \tau)^N$$

for some intermediate value $\xi_l$ between lT and τ. As $(\Delta^N \gamma)_k$ is a linear combination of $g(t_n)$'s with $$t_n = (k+n)T \in [kT, (n+k)T], n = 0, \ldots, N,$$

we choose the anchor point $$\tau = \left(k + \frac{N}{2}\right)T.$$

As $\Delta^N$ annihilates any polynomial of degree N−1, only the remainder term takes effect and we have $$(\Delta^N \gamma)_k = (\Delta_N r)_k = (\Delta^N r^{[k]})_0,$$

where $r^{[k]} = (r_k, r_{k+1}, \ldots, r_{k+N})$.

Noting that for any vector V one has by definition $\|\Delta v\|_\infty \leq \|v\|_\infty$, it follows that $$\|\Delta^N \gamma\|_\infty \leq 2^N \|r^{[k]}\|_\infty$$ (Equation 20)

$$\leq 2^N \frac{\|g^{(N)}\|_\infty}{N!}\left(\frac{NT}{2}\right)^N,$$

$$\leq T^N e^N \|g^{(N)}\|_\infty$$

where in the last step, we used Stirling's approximation.

Proof of Proposition 2:
As usual, let $\bar{a} \triangleq \Delta^N a$. In view of Proposition 1 and Equation 4, a admits a unique decomposition, $a = \mathcal{M}_\lambda\, a + \varepsilon_a$ where $\varepsilon_a$ is a simple function. This allows us to write, $\Delta^N \mathcal{M}_\lambda\, a = \bar{a} = \bar{\varepsilon}_a$. Based on the distributive property of $\llbracket t \rrbracket = t$ mod 1, it follows that, $$\mathcal{M}_\lambda(a_1 + a_2) = \mathcal{M}_\lambda(\mathcal{M}_\lambda(a_1) + \mathcal{M}_\lambda(a_2))$$

And hence, $$\mathcal{M}_\lambda(\Delta^N \mathcal{M}_\lambda(a)) = \mathcal{M}_\lambda(\bar{a} - \bar{\varepsilon}_a) = \mathcal{M}_\lambda(\mathcal{M}_\lambda(\bar{a}) + \mathcal{M}_\lambda(\bar{\varepsilon}_a))$$

Now since $\bar{\varepsilon}_a$ take values $2k\lambda$, $k \in \mathbb{Z}$, $\Delta_N\, \varepsilon_a = \bar{\varepsilon}_a$ takes values of the form $\{(-1)^n\, 2\lambda B_n^N\}_{n=0}^N \in \mathbb{Z}$ where $B_n^N$ is the Binomial coefficient. From this, we conclude that $\bar{\varepsilon}_a$ is in the kernel of $\mathcal{M}_\lambda(\bullet)$ or $\mathcal{M}_\lambda(\bar{\varepsilon}_a) = 0$ and it follows that, $$\mathcal{M}_\lambda(\Delta^N \mathcal{M}_\lambda(a)) = \mathcal{M}_\lambda(\mathcal{M}_\lambda(\bar{a})) = \mathcal{M}_\lambda(\bar{a}),$$

which proves the result in Equation 10.

As noted above, the preceding 55 paragraphs comprise a mathematical proof of guaranteed recovery, in illustrative implementations of this invention.

The five steps of Algorithm 1 (described above) are set forth in FIG. 9. Thus, FIG. 9 illustrates a method 901 of taking modulo samples and recovering an estimate of a bandlimited function from the samples.

Self-Reset ADC

In illustrative implementations of this invention, a self-reset ADC (e.g., 102) may sample an analog, bandlimited signal and may output a digital signal that encodes discrete, modulo samples of the bandlimited signal.

In illustrative implementations of this invention, a self-reset ADC (e.g., 102) may comprise hardware components that, taken as a whole, are configured to perform centered modulo operations processing, sampling and quantization.

In illustrative implementations of the present invention, a wide variety of self-reset ADCs (including well-known, existing, self-reset ADCs) may be employed.

Non-limiting examples of self-reset ADCs that may be employed in the present invention include hardware and functionality described in: (a) Liu et al., U.S. Pat. No. 6,93,796 B2, issued Aug. 9, 2005 ("Liu Patent"); (b) Han et. al, U.S. Pat. No. 7,619,674 B2, issued Nov. 17, 2009 ("Han Patent"); and (c) El Gamal et al., U.S. Pat. No. 7,492,400 B2, issued Feb. 17, 2009 ("El Gamal Patent"). The entire disclosures of the Liu Patent, Han Patent, and El Gamal Patent are incorporated by reference herein.

Figure 10:
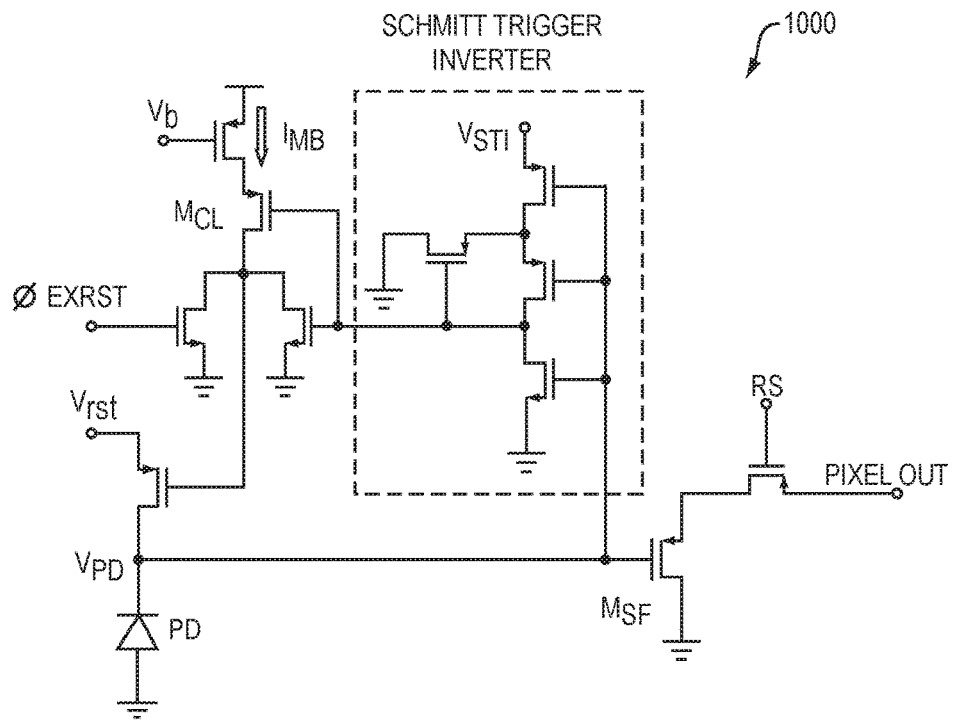
FIGS. 10, 11, 12, 13, and 14 show examples of self-reset ADC hardware.
Figure 11:
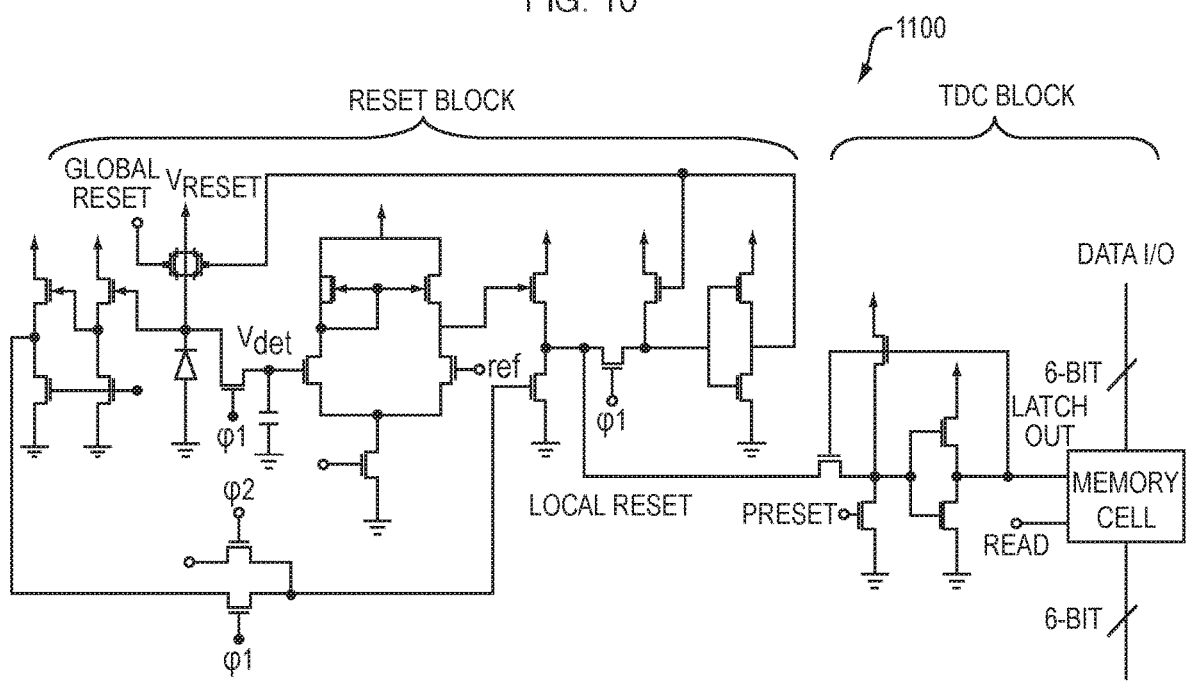
Figure 12:
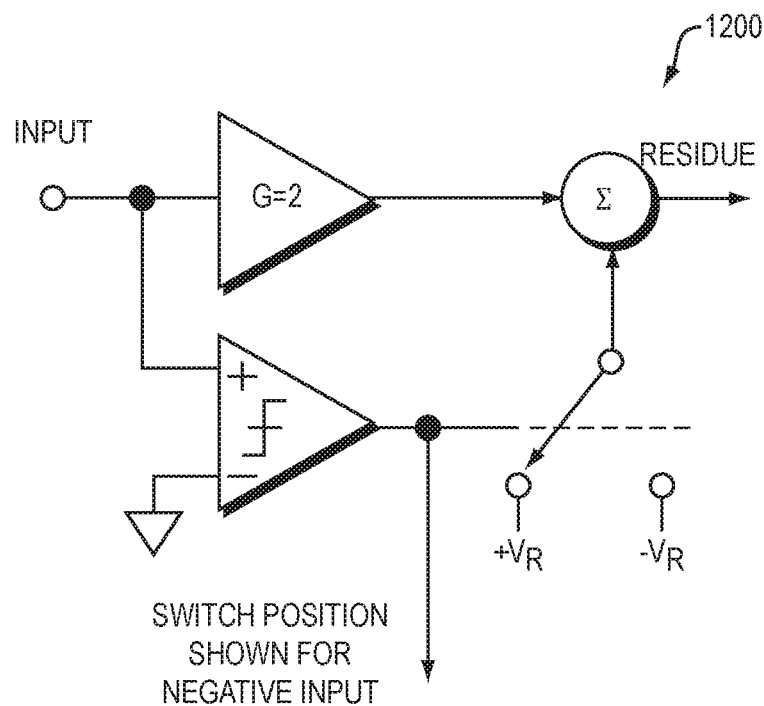
Figure 13:
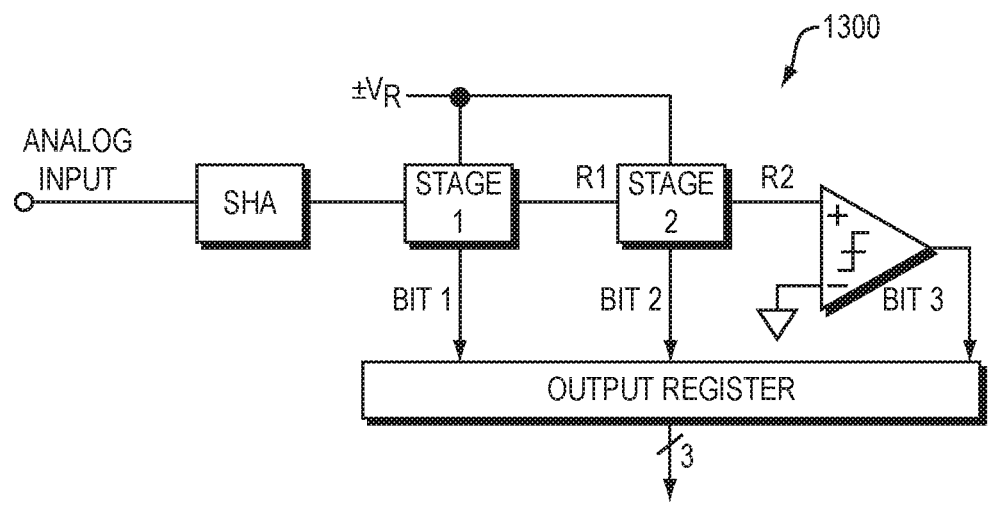
Figure 14:
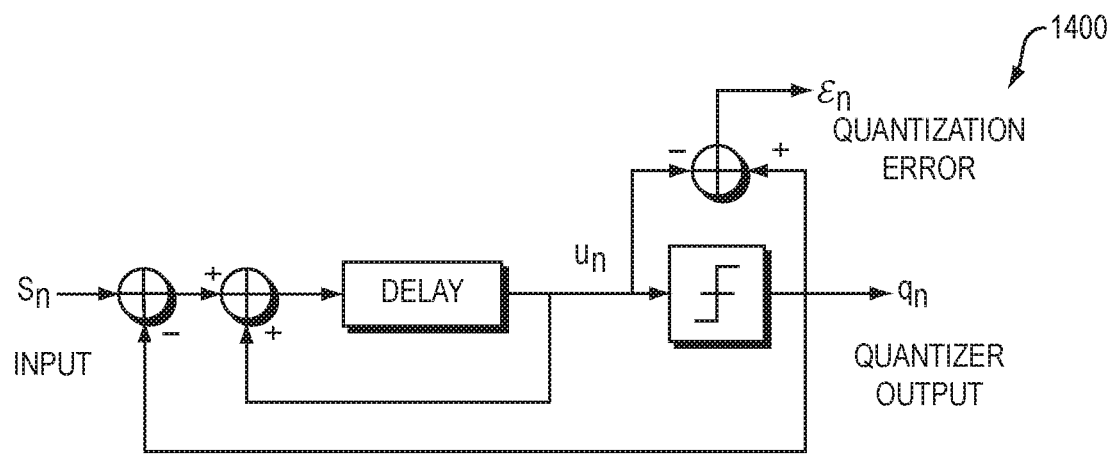
Figure 16:
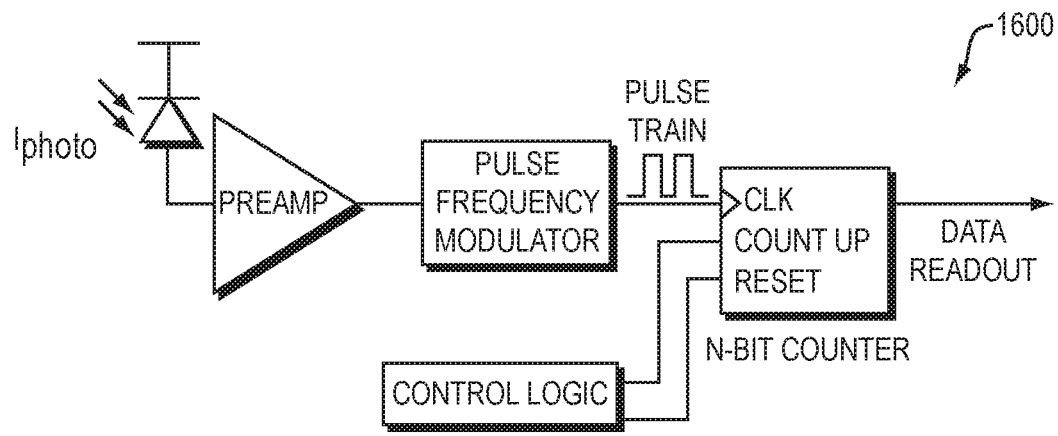
FIG. 16 shows another example of a self-reset ADC.

FIGS. 10, 11, 12, 13, 14, and 16 show more non-limiting examples of self-reset ADC hardware that may be employed in the present invention. FIG. 10 is copy of FIG. 2(a) in Yamaguchi, T., et al., *Implantable self-reset CMOS image sensor and its application to hemodynamic response detection in living mouse brain*; published in 2016 Japanese Journal of Applied Physics 55 04EM02. FIG. 11 is a copy of a portion of FIG. 2 in Rhee, J. et. al, *Wide dynamic range CMOS image sensor with pixel level ADC*; published in Electronics Letters, Volume 39, Issue 4, February 2003. FIGS. 12 and 13 are copies of FIGS. 2 and 3, respectively, in Kester, W., *ADC Architectures VI: Folding ADCs*, MT-025 Tutorial, Rev. A, 10/08; published by Analog Devices. FIG. 14 is a copy of FIG. 2 in Chou, W., et al., *Modulo sigma-delta modulation*; published in IEEE Transactions on Communications, Volume 40, Issue 8, August 1992 (the "Chou Paper"). FIG. 16 is a copy of FIG. 3 in Zhao, H., et al., *Unbounded High Dynamic Range Photography Using a Modulo Camera*; published in 2015 IEEE International Conference on Computational Photography (ICCP).

Hardware 1000, 1100, 1200, 1300, 1400, 1600 is shown in FIGS. 10, 11, 12, 13, 14 and 16. Hardware 1000, 1100, 1200, 1300, 1400, 1600 (or components thereof) may be employed as a self-reset ADC (or as components of a self-reset ADC) in the present invention.

Figure 15:
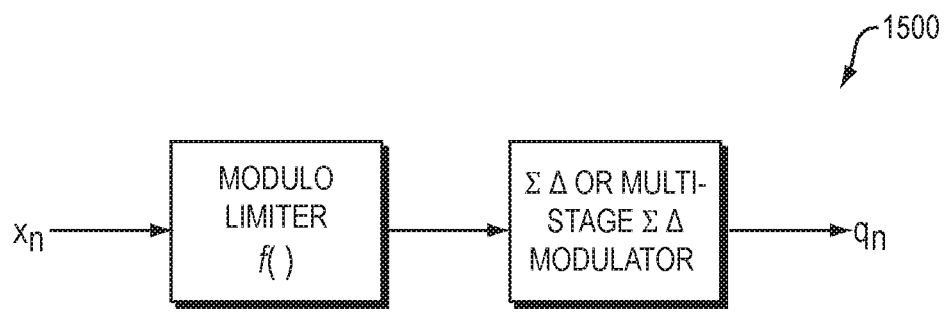
FIG. 15 illustrates an example of functionality of a self-reset ADC.

FIG. 15 illustrates functionality of the self-reset ADC shown in FIG. 14 hereof. FIG. 15 is a copy of FIG. 1 of the Chou Paper. FIG. 15 illustrates two steps that taken together, achieve a sampling process 1500 that includes a centered modulo operation.

As noted above, in the present invention, a self-reset ADC may include: (a) components configured to perform centered modulo or reset operations; (b) components configured to perform sampling; and (c) components configured to perform quantization. In some cases, a component of the self-reset ADC performs more than one of these functions.

In illustrative implementations of this invention, a self-reset ADC may include one or more hardware components that alone or together are configured to perform centered modulo operations. For instance, these components may include one or more reset transistors, diodes, junction capacitors, comparators, feedback loops, memory, and control lines. For example, in some cases, one or more reset transistors, comparators or control lines may control timing of resets and draining or discharge of stored charge.

In illustrative implementations of this invention, a self-reset ADC may include one or more hardware components that alone or together are configured to perform sampling or quantization or both. For instance, in some implementations of this invention, a self-reset ADC may include one or more sampling components or quantization components that alone or together comprise one or more of the following: a direct conversion ADC, flash ADC, parallel comparator ADC, counter type ADC, servo tracking ADCs, successive-approximation ADC, ramp-compare ADC, Wilkinson ADC, integrating ADC, dual-slope ADC, multi-slope ADC, charge balancing ADC, delta-encoded ADC, counter-ramp ADC, pipelined ADC, sub-ranging quantizer, sigma-delta ADC, delta-sigma ADC, time-interleaved ADC, intermediate FM stage ADC, time-stretch ADC, or pulse-code modulator.

In illustrative implementations of this invention, a self-reset ADC (e.g., 102) may perform (and may include hardware configured to perform) sampling using any existing sampling method.

Here are non-limiting examples of quantizer hardware that may be employed in a self-reset ADC in the present invention. In some implementations of the present invention, quantizer hardware in a self-reset ADC may comprise a rate-distortion optimization quantizer, a mid-riser uniform quantizer, a mid-tread uniform quantizer, or a dead-zone quantizer.

In illustrative implementations of this invention, a self-reset ADC (e.g., 102) may comprise what is commonly called a self-reset ADC, a folding ADC, a modulo ADC, or a modulo PCM (pulse-code modulator). A self-reset ADC is a non-limiting example of an ADC.

In many implementations, this invention: (a) does not count the number of resets (also known as "folds") performed to create a modulo sample; and (b) does not use the number of resets as an input to the recovery algorithm. If any existing self-reset ADC hardware (e.g., described above or shown in FIGS. 11-16 hereof) is employed in the present invention and is configured to count the number of resets, then: (a) the number of resets may be disregarded in the recovery algorithm in the present invention; or (b) any hardware component that is exclusively dedicated to counting the number of resets may be disabled or omitted in the present invention. Put differently, in many implementations of the present invention: (a) counting the number of resets (folds) is not necessary; and (b) any hardware component or functionality that is exclusively dedicated to counting the number of resets is superfluous and may be omitted.

In some cases, a self-reset ADC (e.g., 102) in the present invention may include filters, such as analog low-pass filter that are configured to low-pass filter a non-bandlimited analog signal. Furthermore, in some cases, a self-reset ADC (e.g., 102) in the present invention may include signal processing hardware configured to normalize frequency of a signal (e.g., by transforming the frequency in such a way that the resulting signal has a bandwidth of 1 Hz and a maximum frequency of 0.5 Hz) or to un-normalize frequency of the signal (un-normalizing frequency being the inverse operation of normalizing frequency).

More Details

As noted above, N is the order of finite difference approximation. As can be seen from Equation 16 (and Equation C, which is identical), N tends to increase as the sampling interval T increases toward $(\pi e)^{-1}$ seconds per sample—or equivalently, as the sampling rate decreases toward $\pi e$ samples per second. If the sampling rate is very close to $\pi e$ (while remaining greater than $\pi e$), N may be very large, per Equation 16. In many implementations, it is desirable to have a relatively small N, for ease of computations. Thus, in many implementations, it is desirable to select a sampling rate that is larger than, but not too close to, $\pi e$. For instance, in many practical scenarios, it may be desirable to have a sampling rate of 10 samples per second, or to have a sampling rate of $2\pi e$ samples per second. Increasing the sampling rate (while it is greater than $\pi e$)—or equivalently, decreasing the sampling interval (while it is less than $(\pi e)^{-1}$)—tends to make N (the order of finite difference approximation) smaller. As long as the sampling rate is greater than $\pi e$ samples per second (and other conditions discussed herein are satisfied), recovery of the bandlimited signal that is sampled is assured. See mathematical proof, above.

As can be seen from Equation 16 (and Equation C, which is identical), the recovery algorithm discussed above and summarized in FIG. 8 does not work if the sampling rate is equal to $\pi e$ samples per second—or equivalently, if the sampling interval T is equal to $(\pi e)^{-1}$ seconds per sample. This is because, if the sampling interval T is equal to $(\pi e)^{-1}$, then the denominator in the right side of Equation 16 is log (1)=0 and the fraction on the right side of Equation 16 is undefined.

Furthermore, if the sampling rate is greater than 1 sample per second and less than $\pi e$, then the recovery algorithm summarized in FIG. 8 does not work. This is because:

(A) The order of finite difference approximation N depends on the following quantity, per Equation 16:

$$F(\lambda, \beta_g, T) = \frac{\log \lambda - \log \beta_g}{\log(T\pi e)} = \frac{\log(\lambda/\beta_g)}{\log(T\pi e)}$$

(B) If $\beta_g < \lambda$, then no modulo "wrapping" occurs, and we don't care about N. So we will not consider this case.

(C) $\beta_g > \lambda$ is the interesting case. If $\beta_g > \lambda$, then log $\lambda$–log $\beta_g < 0$ and thus the numerator of $F(\lambda, \beta_g, T)$ is negative. Furthermore, if the sampling rate is greater than 1 sample per second and less than $\pi e$ samples per second, then: (a) the denominator of $F(\lambda, \beta_g, T)$ is positive; (b) $F(\lambda, \beta_g, T)$ is negative; and (c) Equation 16 returns a negative number for N. But the order of finite difference approximation N cannot be negative. Thus, if the sampling rate is greater than 1 sample per second and less than $\pi e$, then the recovery algorithm summarized in FIG. 8 does not work.

Let R be the sampling rate in samples per second and T be the sampling interval in seconds per sample. The case when the sampling rate $R \in (1, \pi e)$ or $$T \in \left(\frac{1}{\pi e}, 1\right]$$

uniquely defines a finite-energy, bandlimited function in terms of its modulo samples. Thus, with this choice of sampling rate $R \in (1, \pi e)$, each bandlimited function being sampled has a unique set of modulo samples and the modulo samples can not lead to ambiguity. However, the inventors are not aware of any recovery method whereby, when R∈(1, πe), the resulting modulo samples may be mapped back to unfolded samples. Nor are the inventors aware of any mathematical proof that such recovery of unfolded samples from folded samples is possible where RE (1, πe).

When R>πe or Tπe<1, Equation 10 says that for some T and N, we have $\mathcal{M}_\lambda (\Delta^N \gamma) = \mathcal{M}_\lambda (\Delta^N y)$ at each sample value, where we are given y which are modulo samples and γ which are unfolded samples.

However, when R∈(1, πe) or $$T \in \left(\frac{1}{\pi e}, 1\right),$$

we may still have $\mathcal{M}_\lambda (\Delta^N \gamma) = \mathcal{M}_\lambda (\Delta^N y)$ but not for all samples values of $\{y_k\}_k$.

In some alternative implementations of this invention, R∈(1, πe) and equivalently, $$T \in \left(\frac{1}{\pi e}, 1\right).$$

In these alternative implementation, where sampling rate R is greater than 1 sample per second and less than πe samples per second, recovery from folded modulo samples may be achieved as follows: Suppose we are given a patch of L samples of γ. Then $$T \in \left(\frac{1}{\pi e}, 1\right)$$

suggests that we can recover or unfold samples because in this case of T, $\mathcal{M}_\lambda (\Delta^N \gamma) = \mathcal{M}_\lambda (\Delta^N y)$ will not be exactly satisfied everywhere but the knowledge of L samples of γ can be used to compute locations where error occurs. In this alternative implementation, knowledge of unfolded examples may be used as additional information in the algorithm.

Software

In the Computer Program Listing above, a computer program file named source_code.txt (the "Prototype Software") is listed. This computer program file comprises software employed in a prototype implementation of this invention. To run this as a Matlab® software file, the filename extension would be changed from ".txt" to a ".m" filename extension.

The Prototype Software (1) creates a simulated bandlimited signal with a moderate amount of noise; (2) takes discrete samples from the bandlimited signal; and (3) reconstructs the bandlimited signal from the samples. The Prototype Software also plots results and prints out a report on the reconstruction.

This invention is not limited to the Prototype Software. Other software may be employed. Depending on the particular implementation, the software used in this invention may vary.

Computers

In illustrative implementations of this invention, one or more computers (e.g., servers, network hosts, client computers, integrated circuits, microcontrollers, controllers, field-programmable-gate arrays, personal computers, digital computers, driver circuits, or analog computers) are programmed or specially adapted to perform one or more of the following tasks: (1) to control the operation of, or interface with, hardware components of a self-reset ADC or of a sensor; (2) to recover an estimated signal from samples of the signal; (3) to perform one or more of the computations summarized in FIG. 8 or FIG. 9; (4) to receive data from, control, or interface with one or more sensors; (5) to perform any other calculation, computation, program, algorithm, or computer function described or implied herein; (6) to receive signals indicative of human input; (7) to output signals for controlling transducers for outputting information in human perceivable format; (8) to process data, to perform computations, and to execute any algorithm or software; and (9) to control the read or write of data to and from memory devices (tasks 1-9 of this sentence referred to herein as the "Computer Tasks"). The one or more computers (e.g. 103) may, in some cases, communicate with each other or with other devices: (a) wirelessly, (b) by wired connection, (c) by fiber-optic link, or (d) by a combination of wired, wireless or fiber optic links.

In exemplary implementations, one or more computers are programmed to perform any and all calculations, computations, programs, algorithms, computer functions and computer tasks described or implied herein. For example, in some cases: (a) a machine-accessible medium has instructions encoded thereon that specify steps in a software program; and (b) the computer accesses the instructions encoded on the machine-accessible medium, in order to determine steps to execute in the program. In exemplary implementations, the machine-accessible medium may comprise a tangible non-transitory medium. In some cases, the machine-accessible medium comprises (a) a memory unit or (b) an auxiliary memory storage device. For example, in some cases, a control unit in a computer fetches the instructions from memory.

In illustrative implementations, one or more computers execute programs according to instructions encoded in one or more tangible, non-transitory, computer-readable media. For example, in some cases, these instructions comprise instructions for a computer to perform any calculation, computation, program, algorithm, or computer function described or implied herein. For example, in some cases, instructions encoded in a tangible, non-transitory, computer-accessible medium comprise instructions for a computer to perform the Computer Tasks.

Definitions

The terms "a" and "an", when modifying a noun, do not imply that only one of the noun exists. For example, a statement that "an apple is hanging from a branch": (i) does not imply that only one apple is hanging from the branch; (ii) is true if one apple is hanging from the branch; and (iii) is true if multiple apples are hanging from the branch.

"ADC" means analog-to-digital converter.

"Archimedes' constant" means the ratio of a circle's circumference to its diameter. Archimedes' constant is sometimes called "pi" or "π". Archimedes' constant is an irrational number that is approximately equal to 3.14159.

⌈•⌉ means the ceiling function. That is, for any real number x, ⌈•⌉ is the smallest integer that is greater than or equal to x. For instance, ⌈3.6⌉=4.

To say that a signal has "a bandwidth of 1 Hz and a maximum frequency of 0.5 Hz" means that the Fourier transform of the signal is zero for all frequencies greater than 0.5 Hz and is zero for all frequencies less than −0.5 Hz.

To compute "based on" specified data means to perform a computation that takes the specified data as an input.

"Centered modulo operation", "centered modulo function", "centered modulo sample" and "centered modulo sampling" are defined above.

The term "comprise" (and grammatical variations thereof) shall be construed as if followed by "without limitation". If A comprises B, then A includes B and may include other things.

The term "computer" includes any computational device that performs logical and arithmetic operations. For example, in some cases, a "computer" comprises an electronic computational device, such as an integrated circuit, a microprocessor, a mobile computing device, a laptop computer, a tablet computer, a personal computer, or a mainframe computer. In some cases, a "computer" comprises: (a) a central processing unit, (b) an ALU (arithmetic logic unit), (c) a memory unit, and (d) a control unit that controls actions of other components of the computer so that encoded steps of a program are executed in a sequence. In some cases, a "computer" also includes peripheral units including an auxiliary memory storage device (e.g., a disk drive or flash memory), or includes signal processing circuitry. However, a human is not a "computer", as that term is used herein.

"Defined Term" means a term or phrase that is set forth in quotation marks in this Definitions section.

For an event to occur "during" a time period, it is not necessary that the event occur throughout the entire time period. For example, an event that occurs during only a portion of a given time period occurs "during" the given time period.

"Dynamic range" of a signal means the closed interval bounded by the lowest value of the signal and the highest value of the signal.

The term "e.g." means for example.

Each equation above is referred to herein by the equation number (or letter) set forth to the right of the equation. Non-limiting examples of an "equation", as that term is used herein, include: (a) an equation that states an equality; (b) an in equation that states an inequality (e.g., that a first item is greater than or less than a second item); (c) a mathematical statement of proportionality or inverse proportionality; and (d) a system of equations.

"Euler's number" means the unique number whose natural logarithm is equal to one. Euler's number is a constant that is approximately equal to 2.71828.

The fact that an "example" or multiple examples of something are given does not imply that they are the only instances of that thing. An example (or a group of examples) is merely a non-exhaustive and non-limiting illustration.

Unless the context clearly indicates otherwise: (1) a phrase that includes "a first" thing and "a second" thing does not imply an order of the two things (or that there are only two of the things); and (2) such a phrase is simply a way of identifying the two things, respectively, so that they each may be referred to later with specificity (e.g., by referring to "the first" thing and "the second" thing later). For example, unless the context clearly indicates otherwise, if an equation has a first term and a second term, then the equation may (or may not) have more than two terms, and the first term may occur before or after the second term in the equation. A phrase that includes a "third" thing, a "fourth" thing and so on shall be construed in like manner.

$\lfloor \cdot \rfloor$ means the floor function. That is, for any real number x, $\lfloor x \rfloor$ is the largest integer that is less than or equal to x. For instance, $\lfloor 3.6 \rfloor = 3$.

"For instance" means for example.

To say a "given" X is simply a way of identifying the X, such that the X may be referred to later with specificity. To say a "given" X does not create any implication regarding X. For example, to say a "given" X does not create any implication that X is a gift, assumption, or known fact.

"Herein" means in this document, including text, specification, claims, abstract, and drawings.

"Hz" means Hertz.

"Higher order derivative" means a derivative with an order of two or more. Non-limiting examples of a "higher order derivative" include second order derivative, third order derivative, fourth order derivative, and fifth order derivative.

As used herein: (1) "implementation" means an implementation of this invention; (2) "embodiment" means an embodiment of this invention; (3) "case" means an implementation of this invention; and (4) "use scenario" means a use scenario of this invention.

The term "include" (and grammatical variations thereof) shall be construed as if followed by "without limitation".

The "input" of a computation may be the output of another computation or process.

"Max-norm" of a function means the global maximum of the absolute value of the function. The max-norm of a function U is often symbolized by $\|u\|_\infty$.

"Modulo sample" is defined above.

"Modulus" of a modulo function $f(x)$ means the real number m, such that $f(x)=f(x+km)$, where k is an integer. As a non-limiting example, if $f(x)$ is a centered modulo function with a range of $[-\lambda, \lambda)$, then the modulus of $f(x)$ is $2\lambda$. As another non-limiting example, if $f(x)$ is $\mathcal{M}_\lambda(x)$, as defined herein, then the modulus of $f(X)$ is $2\lambda$.

To "normalize" the frequency of a second, bandlimited signal relative a first bandlimited signal means to adjust an ADC's sampling rate for the second signal, in such a way that the samples obtained by sampling the second signal are identical to those that would have been obtained by sampling the first signal, which first signal: (a) has a bandwidth of 1 Hz and a maximum frequency of 0.5 Hz; and (b) is identical to the second signal except that frequency of the second signal (without taking into account the normalizing) is scaled by a constant factor relative to that of the first signal. If a second signal's frequency has been normalized relative to a first signal by adjusting sampling rate, then samples of the second signal acquired at the adjusted sampling rate shall comprise samples of a "normalized version" of the second signal. If the second signal's frequency has been normalized relative to a first signal, then the normalized version of the second signal shall be treated, for all purposes herein, as being identical to the first signal.

A "de-normalized estimate" of a signal, the frequency of which has been normalized by scaling frequency of the signal by a constant factor $\mu$, means an estimate obtained by scaling frequency of the normalized version of the signal by a constant factor of $1/\mu$.

The term "or" is inclusive, not exclusive. For example, A or B is true if A is true, or B is true, or both A or B are true. Also, for example, a calculation of A or B means a calculation of A, or a calculation of B, or a calculation of A and B.

To say that a computation "outputs" a value does not imply that the value is presented in human-perceptible form to a human user. The "output" of a computation may be an input to another computation or process.

A parenthesis is simply to make text easier to read, by indicating a grouping of words. A parenthesis does not mean that the parenthetical material is optional or may be ignored.

To "perform" a centered modulo operation $f$ means to perform a sequence of steps that, for each particular input X in a set of inputs, respectively, outputs the value of $f$ at X. The steps in the preceding sentence may be performed in any way, including by any combination of one or more of analog computation, digital computation, or other physical processes. As a non-limiting example, the other physical processes in the preceding sentence may include accumulation of electric charge, discharge or draining of electric charge, and readout.

"Range" of a function means the image of the function.

As used herein, the term "set" does not include a group with no elements.

Unless the context clearly indicates otherwise, "some" means one or more.

As used herein, a "subset" of a set consists of less than all of the elements of the set.

The term "such as" means for example.

To say that a machine-readable medium is "transitory" means that the medium is a transitory signal, such as an electromagnetic wave.

A matrix may be indicated by a bold capital letter (e.g., D). A vector may be indicated by a bold lower case letter (e.g., a). However, the absence of these indicators does not indicate that something is not a matrix or not a vector.

Except to the extent that the context clearly requires otherwise, if steps in a method are described herein, then the method includes variations in which: (1) steps in the method occur in any order or sequence, including any order or sequence different than that described herein; (2) any step or steps in the method occurs more than once; (3) any two steps occur the same number of times or a different number of times during the method; (4) any combination of steps in the method is done in parallel or serially; (5) any step in the method is performed iteratively; (6) a given step in the method is applied to the same thing each time that the given step occurs or is applied to different things each time that the given step occurs; (7) one or more steps occur simultaneously, or (8) the method includes other steps, in addition to the steps described herein.

Headings are included herein merely to facilitate a reader's navigation of this document. A heading for a section does not affect the meaning or scope of that section.

This Definitions section shall, in all cases, control over and override any other definition of the Defined Terms. The Applicant or Applicants are acting as his, her, its or their own lexicographer with respect to the Defined Terms. For example, the definitions of Defined Terms set forth in this Definitions section override common usage or any external dictionary. If a given term is explicitly or implicitly defined in this document, then that definition shall be controlling, and shall override any definition of the given term arising from any source (e.g., a dictionary or common usage) that is external to this document. If this document provides clarification regarding the meaning of a particular term, then that clarification shall, to the extent applicable, override any definition of the given term arising from any source (e.g., a dictionary or common usage) that is external to this document. To the extent that any term or phrase is defined or clarified herein, such definition or clarification applies to any grammatical variation of such term or phrase, taking into account the difference in grammatical form. For example, the grammatical variations include noun, verb, participle, adjective, and possessive forms, and different declensions, and different tenses.

Variations

This invention may be implemented in many different ways. Here are some non-limiting examples:

In some implementations, this invention is a method comprising sampling a first analog signal at uniformly spaced times at a sampling rate that is greater than Ire samples per second, wherein (a) e is Euler's number; (b) $\pi$ is Archimedes' constant; (c) the first signal has a bandwidth of 1 Hertz and a maximum frequency of 0.5 Hertz; (d) the sampling includes performing a centered modulo operation, which centered modulo operation has a modulus; and (e) the method includes performing a calculation that (i) takes, as an input, a set of modulo samples created by the sampling, (ii) includes computing finite difference approximations of higher order derivatives of the set of modulo samples, and (iii) outputs an estimate of the first signal, which estimate is equal to the first signal plus a constant, which constant is an integer multiple of the modulus. In some cases, the calculation also includes, in each iteration in a set of multiple iterations, computing a finite antidifference approximation and rounding a number to an integer multiple of the modulus. In some cases, the first signal comprises an electrical signal. In some cases, the method further comprises normalizing frequency of a second analog, bandlimited signal relative to the first signal; and (b) the calculation includes calculating, based on the estimate of the first signal, a de-normalized estimate of the second signal. In some cases, the method further comprises low-pass filtering an analog signal to create (i) the first signal or (ii) a particular bandlimited signal that is identical to the first signal except that frequency of the particular signal is scaled by a constant factor relative to frequency of the first signal. Each of the cases described above in this paragraph is an example of the method described in the first sentence of this paragraph, and is also an example of an embodiment of this invention that may be combined with other embodiments of this invention.

In some implementations, this invention is a method comprising sampling a first analog signal at uniformly spaced times at a sampling rate that is greater than Ire samples per second, wherein (a) e is Euler's number; (b) $\pi$ is Archimedes' constant; (c) the first signal has a bandwidth of 1 Hertz and a maximum frequency of 0.5 Hertz; and (d) the sampling includes performing a centered modulo operation. In some cases: (a) the method further comprises normalizing frequency of a second analog, bandlimited signal relative to the first signal; and (b) the calculation includes calculating, based on the estimate of the first signal, a de-normalized estimate of the second signal. In some cases, the method further comprises low-pass filtering an analog signal to create (i) the first signal or (ii) a particular bandlimited signal that is identical to the first signal except that actual frequency of the particular signal is scaled by a constant factor relative to frequency of the first signal. In some cases, the first signal is an electrical signal. In some cases, the method further comprises performing a computation that: (a) takes, as an input, a set of modulo samples created by the sampling; (b) includes computing finite difference approximations of higher order derivatives of the set of modulo samples; and (c) outputs an estimate of the first signal. In some cases: (a) the centered modulo operation has a modulus; and (b) the method further comprises performing a calculation that (i) takes, as an input, a set of modulo samples created by the sampling, (ii) includes (A) computing finite difference approximations of higher order derivatives of the set of modulo samples, and (B) in each iteration in a set of multiple iterations, computing a finite antidifference approximation and rounding a number to an integer multiple of the modulus, and (iii) outputs an estimate of the first signal. In some cases, the method further comprises: (a) normalizing frequency of a second analog, bandlimited signal relative to the first signal; (b) performing a computation that (i) takes as an input a set of modulo samples created by the sampling, (ii) includes computing finite difference approximations of higher order derivatives of the set of modulo samples, and (iii) outputs an estimate of the first signal; and (c) calculating, based on the estimate of the first signal, a de-normalized estimate of the second signal. In some cases: (a) the centered modulo operation has a modulus; and (b) the method further comprises (i) normalizing frequency of a second bandlimited signal relative to the first signal, a de-normalized estimate of the second signal, (ii) performing a computation that (A) takes as an input a set of modulo samples created by the sampling, (B) includes steps of (I) computing finite difference approximations of higher order derivatives of the set of modulo samples, and (II) in each iteration in a set of multiple iterations, computing a finite antidifference approximation and rounding a number to an integer multiple of the modulus, and (C) outputs an estimate of the first signal, and (iii) calculating, based on the estimate of the first signal, a de-normalized estimate of the second signal. Each of the cases described above in this paragraph is an example of the method described in the first sentence of this paragraph, and is also an example of an embodiment of this invention that may be combined with other embodiments of this invention.

In some implementations, this invention is an apparatus that comprises an analog-to-digital converter (ADC), which ADC is configured to sample a first analog signal at uniformly spaced times at a sampling rate that is greater than Ire samples per second, in such a way that the sampling includes performing a centered modulo operation, wherein: (a) e is Euler's number; (b) π is Archimedes' constant; and (c) the first signal has a bandwidth of 1 Hertz and a maximum frequency of 0.5 Hertz. In some cases, the apparatus includes an analog filter that is configured to low-pass filter a second analog signal to create (i) the first signal or (ii) a particular bandlimited signal that is identical to the first signal except that actual frequency of the particular signal is scaled by a constant factor relative to frequency of the first signal. In some cases, the first signal, which the ADC is configured to sample, is an electrical signal. In some cases, the apparatus further comprises one or more computers which are programmed to perform a calculation that: (a) takes, as an input, a set of modulo samples created by the sampling; (b) includes computing finite difference approximations of higher order derivatives of the set of modulo samples; and (c) outputs an estimate of the first signal. In some cases: (a) the centered modulo operation has a modulus; and (b) the apparatus further comprises one or more computers which are programmed to perform a calculation that (i) takes, as an input, a set of modulo samples created by the sampling, (ii) includes (A) computing finite difference approximations of higher order derivatives of the set of modulo samples, and (B) in each iteration in a set of multiple iterations, computing a finite antidifference approximation and rounding a number to an integer multiple of the modulus, and (iii) outputs an estimate of the first signal. In some cases: (a) the apparatus is configured to normalize frequency of a second analog, bandlimited signal relative to the first signal; and (b) the apparatus also includes one or more computers which are programmed (i) to perform a calculation that (A) takes, as an input, a set of modulo samples created by the sampling, (B) includes computing finite difference approximations of higher order derivatives of the set of modulo samples, and (C) outputs an estimate of the first signal, and (ii) to calculate, based on the estimate of the first signal, a de-normalized estimate of the second signal. In some cases: (a) the centered modulo operation has a modulus; (b) the apparatus is configured to normalize frequency of a second analog, bandlimited signal relative to the first signal; and (c) the apparatus also includes one or more computers which are programmed (i) to perform a calculation that (A) takes, as an input, a set of modulo samples created by the sampling, (B) includes (I) computing finite difference approximations of higher order derivatives of the set of modulo samples, and (II) in each iteration in a set of multiple iterations, computing a finite antidifference approximation and rounding a number to an integer multiple of the modulus, and (C) outputs an estimate of the first signal, and (ii) to calculate, based on the estimate of the first signal, a de-normalized estimate of the second signal. Each of the cases described above in this paragraph is an example of the apparatus described in the first sentence of this paragraph, and is also an example of an embodiment of this invention that may be combined with other embodiments of this invention.

Each description herein (or in the Provisional) of any method, apparatus or system of this invention describes a non-limiting example of this invention. This invention is not limited to those examples, and may be implemented in other ways.

Each description herein (or in the Provisional) of any prototype of this invention describes a non-limiting example of this invention. This invention is not limited to those examples, and may be implemented in other ways.

Each description herein (or in the Provisional) of any implementation, embodiment or case of this invention (or any use scenario for this invention) describes a non-limiting example of this invention. This invention is not limited to those examples, and may be implemented in other ways.

Each Figure herein (or in the Provisional) that illustrates any feature of this invention shows a non-limiting example of this invention. This invention is not limited to those examples, and may be implemented in other ways.

Any document that is incorporated by reference herein ("incorporated document") does not limit the scope of this invention (including the scope of any hardware, hardware component, method, process, step, software, algorithm, feature, or technology that is described in the main part of this document). Any incorporated document shall only expand—and shall not limit—the scope of this invention. For example, if any given feature described in any incorporated document is different from, or in addition to, the features described in the main part of this document, this additional or different feature of the incorporated document does not limit any implementation of this invention described in the main part of this document. As used herein, the "main part of this document" means this entire document (including any drawings listed in the Brief Description of Drawings above and any software file listed in the Computer Program Listing section above), except that the "main part of this document" does not include any document that is incorporated by reference herein.

The above description (including without limitation any attached drawings and figures) describes illustrative implementations of the invention. However, the invention may be implemented in other ways. The methods and apparatus which are described herein are merely illustrative applications of the principles of the invention. Other arrangements, methods, modifications, and substitutions by one of ordinary skill in the art are also within the scope of the present invention. Numerous modifications may be made by those skilled in the art without departing from the scope of the invention. Also, this invention includes without limitation each combination and permutation of one or more of the implementations (including hardware, hardware components, methods, processes, steps, software, algorithms, features, or technology) that are described herein.

What is claimed:

1. A method comprising sampling, with an analog-to-digital converter, a first analog signal at uniformly spaced times at a sampling rate that is greater than ire samples per second, wherein
(a) e is Euler's number;
(b) π is Archimedes' constant;
(c) the first signal has a bandwidth of 1 Hertz and a maximum frequency of 0.5 Hertz;
(d) the sampling includes performing a centered modulo operation, which centered modulo operation has a modulus; and
(e) the method includes performing a calculation that
(i) takes, as an input, a set of modulo samples created by the sampling,
(ii) includes computing finite difference approximations of higher order derivatives of the set of modulo samples, and
(iii) outputs an estimate of the first signal, which estimate is equal to the first signal plus a constant, which constant is an integer multiple of the modulus.

2. The method of claim 1, wherein the calculation also includes, in each iteration in a set of multiple iterations, computing a finite antidifference approximation and rounding a number to an integer multiple of the modulus.

3. The method of claim 1, wherein the first signal comprises an electrical signal.

4. The method of claim 1, wherein:
(a) the method further comprises normalizing frequency of a second analog, bandlimited signal relative to the first signal; and
(b) the calculation includes calculating, based on the estimate of the first signal, a de-normalized estimate of the second signal.

5. The method of claim 1, wherein the method further comprises low-pass filtering an analog signal to create (i) the first signal or (ii) a particular bandlimited signal that is identical to the first signal except that frequency of the particular signal is scaled by a constant factor relative to frequency of the first signal.

6. A method comprising sampling, with an analog-to-digital converter, a first analog signal at uniformly spaced times at a sampling rate that is greater than ire samples per second, wherein
(a) e is Euler's number;
(b) π is Archimedes' constant;
(c) the first signal has a bandwidth of 1 Hertz and a maximum frequency of 0.5 Hertz; and
(d) the sampling includes performing a centered modulo operation.

7. The method of claim 6, wherein:
(a) the method further comprises normalizing frequency of a second analog, bandlimited signal relative to the first signal; and
(b) the calculation includes calculating, based on the estimate of the first signal, a de-normalized estimate of the second signal.

8. The method of claim 6, wherein the method further comprises low-pass filtering an analog signal to create (i) the first signal or (ii) a particular bandlimited signal that is identical to the first signal except that actual frequency of the particular signal is scaled by a constant factor relative to frequency of the first signal.

9. The method of claim 6, wherein the first signal is an electrical signal.

10. The method of claim 6, wherein the method further comprises performing a computation that:
(a) takes, as an input, a set of modulo samples created by the sampling;
(b) includes computing finite difference approximations of higher order derivatives of the set of modulo samples; and
(c) outputs an estimate of the first signal.

11. The method of claim 6, wherein:
(a) the centered modulo operation has a modulus; and
(b) the method further comprises performing a calculation that
(i) takes, as an input, a set of modulo samples created by the sampling,
(ii) includes
(A) computing finite difference approximations of higher order derivatives of the set of modulo samples, and
(B) in each iteration in a set of multiple iterations, computing a finite antidifference approximation and rounding a number to an integer multiple of the modulus, and
(iii) outputs an estimate of the first signal.

12. The method of claim 6, wherein the method further comprises:
(a) normalizing frequency of a second analog, bandlimited signal relative to the first signal;
(b) performing a computation that
(i) takes as an input a set of modulo samples created by the sampling,
(ii) includes computing finite difference approximations of higher order derivatives of the set of modulo samples, and
(iii) outputs an estimate of the first signal; and
(c) calculating, based on the estimate of the first signal, a de-normalized estimate of the second signal.

13. The method of claim 6, wherein:
(a) the centered modulo operation has a modulus; and
(b) the method further comprises
(i) normalizing frequency of a second bandlimited signal relative to the first signal,
(ii) performing a computation that
(A) takes as an input a set of modulo samples created by the sampling,
(B) includes steps of
(I) computing finite difference approximations of higher order derivatives of the set of modulo samples, and
(II) in each iteration in a set of multiple iterations, computing a finite antidifference approximation and rounding a number to an integer multiple of the modulus, and
(C) outputs an estimate of the first signal, and
(iii) calculating, based on the estimate of the first signal, a de-normalized estimate of the second signal.

14. An apparatus that comprises an analog-to-digital converter (ADC), which ADC is configured to sample a first analog signal at uniformly spaced times at a sampling rate that is greater than πe samples per second, in such a way that the sampling includes performing a centered modulo operation, wherein:
- (a) e is Euler's number;
- (b) π is Archimedes' constant
- (c) the first signal has a bandwidth of 1 Hertz and a maximum frequency of 0.5 Hertz; and
- (d) the apparatus includes an analog filter that is configured to low-pass filter a second analog signal to create (i) the first signal or (ii) a particular bandlimited signal that is identical to the first signal except that actual frequency of the particular signal is scaled by a constant factor relative to frequency of the first signal.

15. An apparatus that comprises an analog-to-digital converter (ADC), which ADC is configured to sample a first analog signal at uniformly spaced times at a sampling rate that is greater than πe samples per second, in such a way that the sampling includes performing a centered modulo operation, wherein:
- (a) e is Euler's number;
- (b) π is Archimedes' constant
- (c) the first signal has a bandwidth of 1 Hertz and a maximum frequency of 0.5 Hertz; and
- (d) the apparatus further comprises one or more computers which are programmed to perform a calculation that
  - (i) takes, as an input, a set of modulo samples created by the sampling,
  - (ii) includes computing finite difference approximations of higher order derivatives of the set of modulo samples, and
  - (iii) outputs an estimate of the first signal.

16. An apparatus that comprises an analog-to-digital converter (ADC), which ADC is configured to sample a first analog signal at uniformly spaced times at a sampling rate that is greater than πe samples per second, in such a way that the sampling includes performing a centered modulo operation, wherein:
- (a) e is Euler's number;
- (b) π is Archimedes' constant
- (c) the first signal has a bandwidth of 1 Hertz and a maximum frequency of 0.5 Hertz;
- (d) the centered modulo operation has a modulus; and
- (e) the apparatus further comprises one or more computers which are programmed to perform a calculation that
  - (i) takes, as an input, a set of modulo samples created by the sampling,
  - (ii) includes
    - (A) computing finite difference approximations of higher order derivatives of the set of modulo samples, and
    - (B) in each iteration in a set of multiple iterations, computing a finite antidifference approximation and rounding a number to an integer multiple of the modulus, and
  - (iii) outputs an estimate of the first signal.

17. An apparatus that comprises an analog-to-digital converter (ADC), which ADC is configured to sample a first analog signal at uniformly spaced times at a sampling rate that is greater than πe samples per second, in such a way that the sampling includes performing a centered modulo operation, wherein:
- (a) e is Euler's number;
- (b) π is Archimedes' constant
- (c) the first signal has a bandwidth of 1 Hertz and a maximum frequency of 0.5 Hertz;
- (d) the apparatus is configured to normalize frequency of a second analog, bandlimited signal relative to the first signal; and
- (e) the apparatus also includes one or more computers which are programmed
  - (i) to perform a calculation that
    - (A) takes, as an input, a set of modulo samples created by the sampling,
    - (B) includes computing finite difference approximations of higher order derivatives of the set of modulo samples, and
    - (C) outputs an estimate of the first signal, and
  - (ii) to calculate, based on the estimate of the first signal, a de-normalized estimate of the second signal.

18. An apparatus that comprises an analog-to-digital converter (ADC), which ADC is configured to sample a first analog signal at uniformly spaced times at a sampling rate that is greater than πe samples per second, in such a way that the sampling includes performing a centered modulo operation, wherein:
- (a) e is Euler's number;
- (b) π is Archimedes' constant
- (c) the first signal has a bandwidth of 1 Hertz and a maximum frequency of 0.5 Hertz;
- (d) the centered modulo operation has a modulus;
- (e) the apparatus is configured to normalize frequency of a second analog, bandlimited signal relative to the first signal; and
- (f) the apparatus also includes one or more computers which are programmed
  - (i) to perform a calculation that
    - (A) takes, as an input, a set of modulo samples created by the sampling,
    - (B) includes
      - (I) computing finite difference approximations of higher order derivatives of the set of modulo samples, and
      - (II) in each iteration in a set of multiple iterations, computing a finite antidifference approximation and rounding a number to an integer multiple of the modulus, and
    - (C) outputs an estimate of the first signal, and
  - (ii) to calculate, based on the estimate of the first signal, a de-normalized estimate of the second signal.

\* \* \* \* \*